US006788385B2

(12) United States Patent
Tanaka et al.

(10) Patent No.: US 6,788,385 B2
(45) Date of Patent: Sep. 7, 2004

(54) STAGE DEVICE, EXPOSURE APPARATUS AND METHOD

(75) Inventors: Keiichi Tanaka, Funabashi (JP); Michael Binnard, Belmont, CA (US); Robert Martinek, deceased, late of Sunnyvale, CA (US), by Daniel Martinek, legal representative; Andrew J. Hazelton, San Carlos, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/134,607

(22) Filed: Apr. 30, 2002

(65) Prior Publication Data

US 2002/0196421 A1 Dec. 26, 2002

Related U.S. Application Data

(60) Provisional application No. 60/299,457, filed on Jun. 21, 2001.

(51) Int. Cl.[7] ............. G03B 27/42; G03B 27/58; G03B 27/32
(52) U.S. Cl. ............. 355/53; 355/72; 355/77
(58) Field of Search ............. 355/53, 72, 75, 355/77

(56) References Cited

U.S. PATENT DOCUMENTS

| | | | | | |
|---|---|---|---|---|---|
| 4,780,617 | A | * | 10/1988 | Umatate et al. | 250/548 |
| 5,172,160 | A | * | 12/1992 | Van Eijk et al. | 355/53 |
| 5,473,410 | A | * | 12/1995 | Nishi | 355/53 |
| 5,715,064 | A | * | 2/1998 | Lin | 356/401 |
| 5,774,205 | A | * | 6/1998 | Sato | 355/53 |
| 5,844,247 | A | * | 12/1998 | Nishi | 250/548 |
| 5,969,441 | A | * | 10/1999 | Loopstra et al. | 248/178.1 |
| 6,246,204 | B1 | * | 6/2001 | Ebihara et al. | 318/649 |
| 6,262,796 | B1 | * | 7/2001 | Loopstra et al. | 355/53 |
| 6,271,606 | B1 | * | 8/2001 | Hazelton | 250/491.1 |
| 6,281,655 | B1 | * | 8/2001 | Poon et al. | 318/568.17 |
| 6,337,484 | B1 | * | 1/2002 | Loopstra et al. | 250/442.11 |
| 6,341,007 | B1 | | 1/2002 | Nishi et al. | 355/53 |
| 6,359,679 | B1 | * | 3/2002 | Ito et al. | 355/53 |
| 6,366,342 | B2 | * | 4/2002 | Tanaka | 250/492.2 |
| 6,400,441 | B1 | * | 6/2002 | Nishi et al. | 355/53 |
| 6,417,914 | B1 | * | 7/2002 | Li | 310/12 |
| 6,426,790 | B1 | * | 7/2002 | Hayashi | 355/72 |
| 2002/0075467 | A1 | * | 6/2002 | Tanaka et al. | 355/57 |
| 2002/0117109 | A1 | * | 8/2002 | Hazelton et al. | 118/620 |

FOREIGN PATENT DOCUMENTS

| | | | |
|---|---|---|---|
| JP | A 61-44429 | | 3/1986 |
| JP | 4-196513 | * | 7/1992 |
| JP | 7-176468 | * | 7/1995 |
| JP | A 8-63231 | | 3/1996 |
| JP | 10-214783 | * | 8/1998 |

* cited by examiner

*Primary Examiner*—Alan Mathews
(74) *Attorney, Agent, or Firm*—Oliff & Berridge PLC

(57) ABSTRACT

In a stage device of an exposure apparatus, a first stage is driven in the X-axis direction by a first X-axis motor while being supported at one side by a first guide bar, and a second stage is driven in the X-axis direction by a second X-axis motor while being supported at one side by a second guide bar. The first guide bar and the second guide bar are independently driven in the Y-axis direction by a Y-axis linear motor. In a state in which the first guide bar and the second guide bar are closest to each other, the end of the first stage opposite from the side supported by the first guide bar is placed above the second guide bar, and the end of the second stage opposite from the side supported by the second guide bar is placed above the first guide bar. First and second substrate tables are supported above the first and second stages, respectively, via first and second minutely driving devices. The above configuration of the stage device permits and restrains a change in attitude of each stage due to driving of the substrate table.

62 Claims, 14 Drawing Sheets

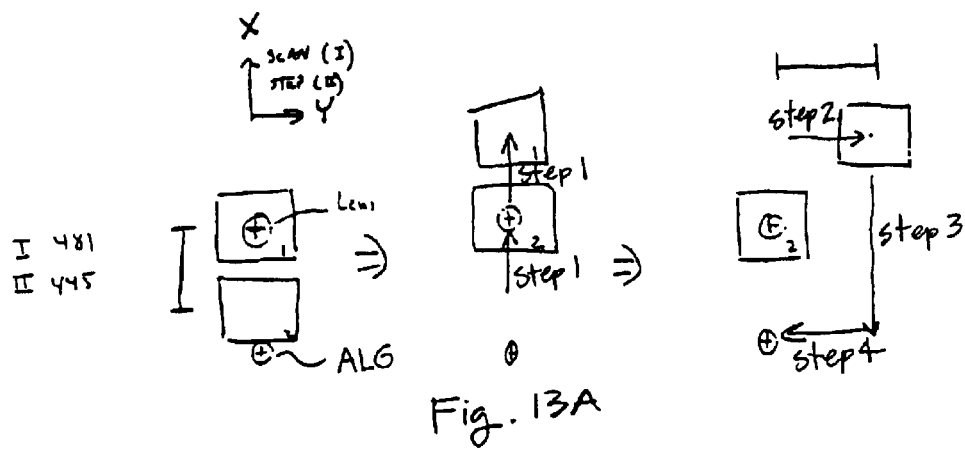
Fig. 13A
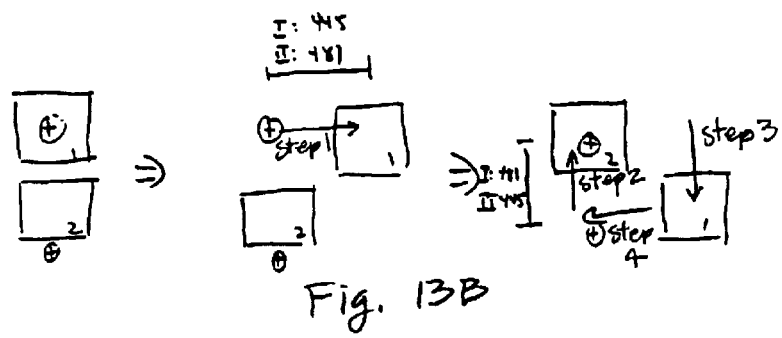
Fig. 13B
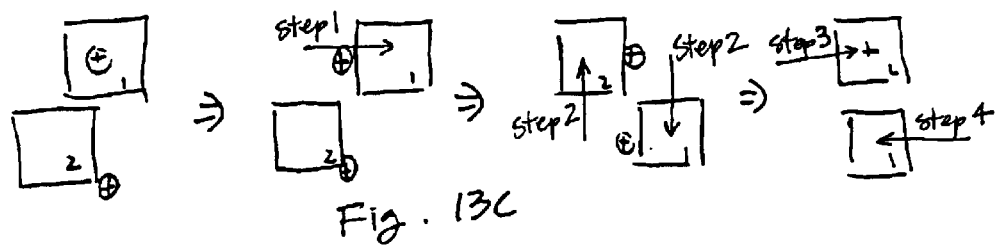
Fig. 13C
| Sequence | Base Size | Switch Stage |
|---|---|---|
| 13A | 3 X 3 WS | WS |
| 13B | 2 X 3 WS | WS + WS |
| 13C | 2 X 2 WS | ½WS + WS + ½WS |
Fig. 13D

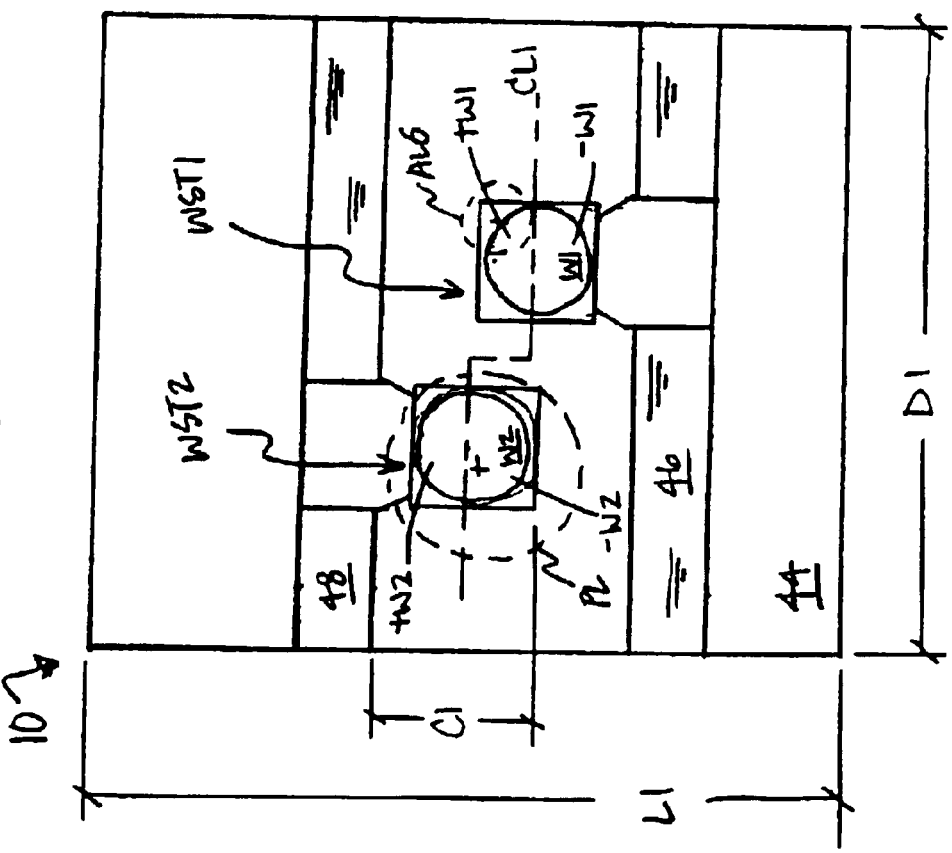

STAGE DEVICE, EXPOSURE APPARATUS AND METHOD

CROSS-REFERENCE TO RELATED APPLICATION

This non-provisional application claims the benefit of U.S. Provisional Application No. 60/299,457, filed Jun. 21, 2001.

BACKGROUND OF THE INVENTION

1. Field of Invention

The present invention relates to a stage device and an exposure apparatus, and more particularly, to a stage device having a plurality of stages, and an exposure apparatus having the stage device.

2. Description of Related Art

Various types of exposure apparatus are conventionally used in photolithographic processes for manufacturing semiconductor devices (ICs), liquid crystal display devices, and the like. In recent years, stepping projection exposure apparatus, such as a step-and-repeat reduction projection exposure apparatus (a so-called "stepper") and a step-and-scan projection exposure apparatus (a so-called "scanning stepper") have been mainly used.

Since this type of projection exposure apparatus is principally used to mass-produce semiconductor devices and the like, it has been inevitably necessary to increase the number of wafers to be exposed in a given period, that is, to enhance throughput.

Operation of the projection exposure apparatus is generally carried out in the following manner:

(a) First, a wafer is loaded onto a wafer table by a wafer loader in a wafer loading step.

(b) An alignment step is performed so as to find the positions of the shot areas on the wafer. The alignment step usually employs EGA (Enhanced Global Alignment). In this method, the positions of alignment marks (wafer marks) made in a plurality of sample shot areas selected beforehand from the shot areas of the wafer are sequentially measured, and layout data on all the shot areas is found by statistical calculations using the so-called least squares method or the like based on the results of measurement and the designed shot layout (see Japanese Unexamined Patent Application Publication No. 61-44429 and U.S. Pat. No. 4,780,617 corresponding thereto). This makes it possible to find the coordinate position of each shot area with high throughput and with relatively high precision.

(c) In the next exposure step, the shot areas on the wafer are sequentially positioned at an exposure position based on the coordinate positions thereof determined by EGA or the like and the previously measured base line distance, and an image of the pattern on the reticle is transferred onto the wafer via a projection optical system.

(d) In a wafer unloading step, the wafer on the wafer table, which has been exposed, is unloaded by using a wafer unloader. This step is performed simultaneously with the above-described wafer loading step (a). That is, the steps (a) and (d) form a wafer replacement step.

In the conventional projection exposure apparatus, broadly, three operations, wafer replacement, alignment, and exposure, are thus repeated on one wafer stage.

Accordingly, by concurrently performing at least parts of the above three operations, i.e., wafer replacement, alignment, and exposure, throughput can be made higher than that in a case in which the operations are sequentially performed. Exposure is not carried out during wafer replacement and alignment. In order to reduce the operating time, that is, to enhance throughput, for example, a stage for wafer replacement and alignment and a stage for exposure are concurrently and independently controlled.

An exposure apparatus having such two stages, which are independently movable, (hereinafter referred to as a "twin-stage type exposure apparatus") is disclosed in, for example, U.S. Pat. No. 5,715,064.

In the exposure apparatus disclosed in the above publication, alignment is effected on one of the stages concurrently with exposure of a wafer on the other stage. In this case, throughput is markedly enhanced, compared with the case in which alignment and exposure are sequentially effected.

When two wafer stages are simply placed, however, the footprint of the exposure apparatus is increased.

In order to effect high-precision exposure, the wafer table with the wafer thereon must be driven for Z-driving so as to control the focusing and leveling of the wafer during alignment as well as exposure. Since two wafer stages are placed side by side on a surface plate in the conventional twin-stage type exposure apparatus, however, reaction force produced due to the Z-tilting driving of the wafer table on one of the wafer stages, which is subjected to exposure, may vibrate the wafer table on the other wafer stage, and this may result in lower exposure accuracy.

SUMMARY OF THE INVENTION

The present invention has been made in view of the above circumstances, and a first object of the present invention is to provide a stage device which has a footprint equivalent to that of a single-stage type stage device and which allows two stages to be independently and freely moved.

A second object of the present invention is to provide an exposure apparatus which reduces the footprint thereof and enhances throughput and exposure accuracy.

According to a first aspect of the present invention, there is provided a stage device having a first stage and a second stage, including: a first driving device having a first moving member and a first stationary member so as to drive the first stage in a first direction; a second driving device having a second moving member and a second stationary member so as to drive the second stage in the first direction; a first guide bar provided with the first stationary member so as to movably support one side of the first stage; and a second guide bar provided with the second stationary member so as to movably support one side of the second stage, the second guide bar being placed at a predetermined distance from the first guide bar in a second direction orthogonal to the first direction.

In the above stage device, the first stage is driven along the first guide bar in the first direction by the first driving device while it is supported on one side by the first guide bar. The second stage is driven along the second guide bar in the first direction by the second driving device while it is supported on one side by the second guide bar. In this case, the first guide bar and the second guide bar can be placed close to each other by, for example, adopting a structure in which the other end of the first stage opposite from the side supported by the first guide bar is placed above the second guide bar, that is, in which a part of the moving range of the first stage is set above the second guide bar. This makes it possible to independently and freely move two stages in a footprint slightly larger than that of a single-stage type stage device.

The stage device may further include a third driving device for driving at least one of the first guide bar and the second guide bar in the second direction. In this case, since the first guide bar and the second guide bar can be moved close to and apart from each other, any serious problem is not caused by the structure in which the other side of the first stage opposite from the side supported by the first guide bar is placed above the second guide bar and the other side of the second stage opposite from the side supported by the second guide bar is placed above the first guide bar, that is, in which the moving range of the first stage and the moving range of the second stage partly overlap with each other. Therefore, it is possible to independently and freely move the two stages in a footprint approximately equal to that of a single-stage type stage device. In particular, in a case in which the third driving device independently drives the first guide bar and the second guide bar in the second direction, the two stages can be independently and freely moved in two-dimensional directions. This further reduces the size of the stage device.

Preferably, the point of action of driving force in the first direction is set at the center of gravity of each of the first and second stages. This can prevent unnecessary rotation moment from acting on the first and second stages when the stages are driven in the first direction.

The stage device may further include: a first table disposed on the first stage so as to hold a first sample; a first minutely driving device connected to the first stage so as to minutely drive the first table in at least one degree-of-freedom; a second table disposed on the second stage so as to hold a second sample; and a second minutely driving device connected to the second stage so as to minutely drive the second table in at least one degree-of-freedom. In this case, when the first table is minutely driven in at least one degree-of-freedom by the first minutely driving device, the first stage is turned by a predetermined amount on a predetermined rotation axis passing through the center of gravity thereof by reaction force produced due to the minute driving of the first table, thereby absorbing the reaction force. Similarly, when the second table is minutely driven in at least one degree-of-freedom by the second minutely driving device, the second stage is turned by a predetermined amount on a predetermined rotation axis passing through the center of gravity thereof by reaction force produced due to the minute driving of the second table, thereby absorbing the reaction force.

The stage device may further include: a first restraint force generating mechanism for generating restraint force for restraining a change in attitude of the first stage resulting from reaction force produced due to the minute driving of the first table; and a second restraint force generating mechanism for generating restraint force for restraining a change in attitude of the second stage resulting from reaction force produced due to the minute driving of the second table. This makes it possible to restrain or prevent a change in attitude of the first table or the second table, as necessary.

The stage device may further include a control device for subjecting the first restraint force generating mechanism to feed-forward control in synchronization with the driving of the first table by the first minutely driving device and for subjecting the second restraint force generating mechanism to feed-forward control in synchronization with the driving of the second table by the second minutely driving device. In this case, it is possible to prevent changes in attitude of the stages. That is, it is possible to minutely drive the first table and the second table while maintaining the original positions of the first stage and the second stage.

According to a second aspect of the present invention, there is provided an exposure apparatus for forming a predetermined pattern on a substrate by exposing the substrate to an energy beam, the exposure apparatus including the stage device in which the substrate is mounted on the first table and the second table as the first sample and the second sample.

Since the exposure apparatus includes the stage device, the footprint of the stage device can be limited so as to be slightly larger than that of a single-stage type stage device. Furthermore, at least one of substrate replacement and alignment can be effected on one of the tables concurrently with exposure of a substrate on the other table. Furthermore, reaction force against the force of driving of the first table by the first minutely driving device will not vibrate the second table, and reaction force against the force of driving of the second table by the second minutely driving device will not vibrate the first table. For this reason, for example, even when one of the tables is driven to subject a substrate thereon to alignment, reaction force produced due to the driving will not vibrate the other table where exposure is effected. Therefore, it is possible not only to reduce the footprint, but also to enhance throughput by concurrently processing the substrates on the two tables and to enhance exposure accuracy.

The exposure apparatus may further include a first restraint force generating mechanism for generating restraint force for restraining a change in attitude of the first stage resulting from reaction force produced due to the minute driving of the first table, and a second restraint force generating mechanism for generating restraint force for restraining a change in attitude of the second stage resulting from reaction force produced due to the minute driving of the second table. In this case, for example, high-precision focusing and leveling control can be exerted on the table on the stage where exposure is effected (that is, a substrate on the table) by restraining a change in attitude of the stage by the corresponding restraint force generating mechanism.

The exposure apparatus may further include a control device for subjecting the first restraint force generating mechanism to feed-forward control in synchronization with the driving of the first table by the first minutely driving device and for subjecting the second restraint force generating mechanism to feed-forward control in synchronization with the driving of the second table by the second minutely driving device.

The exposure apparatus may further include: a single mark detection system for detecting a position detection mark formed on the substrate on each of the first and second stages when the stage is moved into a first region; and a single projection optical system for projecting the energy beam onto the substrate on each of the first and second stages when the stage is moved into a second region.

A second embodiment of the present invention is to provide an exposure apparatus having a shortened overhang cantilever. The footprint of the shortened overhang cantilever is compact and is synchronized to compensate for the reduced overhang. The exposure apparatus may further include X and Y trim adjustment motors for making minor adjustments.

According to the stage device of the second embodiment, a distance between the first guide bar and the second guide bar is defined as a predetermined minimum such that the first stage and the second stage move in a synchronized manner. The first stage and the second stage are formed in the shape of a cantilever. The overhang distance of the cantilever is minimized such that the cantilever is long enough to be placed adjacent to a wafer loader located on a side of the stage device.

In the above stage device, a first table disposed on the first stage holds a first sample and a second table disposed on the second stage to hold a second sample. The overhang distance of the cantilever is minimized such that the first sample on the first table and the second sample on the second table are exposed and aligned, respectively. The movement of the exposure and alignment of the samples is synchronized into similar predetermined regions on the samples. At least two predetermined regions are defined above and below a centerline through the first and second sample. The predetermined regions being simultaneously exposed and aligned are defined above the centerline. In a second region, the predetermined regions being simultaneously exposed and aligned are defined below the centerline. And, in a third region, the predetermined regions being simultaneously exposed and aligned are defined at approximately near the centerline of both samples.

A third embodiment of the present invention is to provide an exposure apparatus having a reaction frame configuration including X and Y magnets, and X and Y coils. A pair of Y-axis linear motors (or third driving devices) include a Y magnet and a Y coil, respectively. The Y magnet is constructed in the shape of a sleeve having a rectangular shaped cross section. At least a portion of the rectangular sleeve (or Y magnet) is attached to the first guide bar. The Y coil is bordered by the two frame guides and extends longitudinally (in the Y direction) between two reaction frame supports. The rectangular sleeve shaped Y magnet encircles the Y-coil and frame guides and translates in the Y direction. The Y magnet and the Y coil are opposed thereto and constitute a moving coil type Y-axis linear motor.

A fourth embodiment of the present invention is to provide an exposure apparatus having shortened first and second guide arms.

According to the stage device of the fourth embodiment, the third driving force drives the at least one guide bar at one end. The first stage extends and retracts in a direction parallel to the longitudinal axis of the first guide bar; and the second stage extends and retracts in a direction parallel to the longitudinal axis of the second guide bar. Further included in the stage device of the fourth embodiment is at least one guide bar having an anti-torque actuator located at the one end for counteracting the torque being applied by translating forces acting on the guide arms and the wafer stage tables.

In another aspect of the present invention, a method and apparatus is provided for switching stage configuration sequences. Since rapid exposure of wafers is desirable in an exposure apparatus, the faster that a wafer positioned under an exposure lens can be replaced with a wafer from under the alignment lens, the greater the efficiency and throughput manufacturing of exposed wafers.

Further objects, features, and advantages of the present invention will become apparent from the following description of the preferred embodiment with reference to the attached drawings.

BRIEF DESCRIPTION OF THE DRAWINGS

The invention will be described with reference to the following drawings, which illustrate exemplary preferred embodiments, and wherein:

FIG. 13A is a schematic view illustrating a first stage switching sequence;

FIG. 13B is a schematic view illustrating a second stage switching sequence;

FIG. 13C is a schematic view illustrating a third stage switching sequence;

FIG. 13D is a table referring to the three separate stage switching sequences;

FIG. 14A is a plan view of the first embodiment as shown in FIG. 3; and

FIG. 14B is a plan view of the second embodiment as shown in FIG. 8.

DETAILED DESCRIPTION OF PREFERRED EMBODIMENTS

An embodiment of the present invention will be described below with reference to FIGS. 1 to 7.

Figure 1:
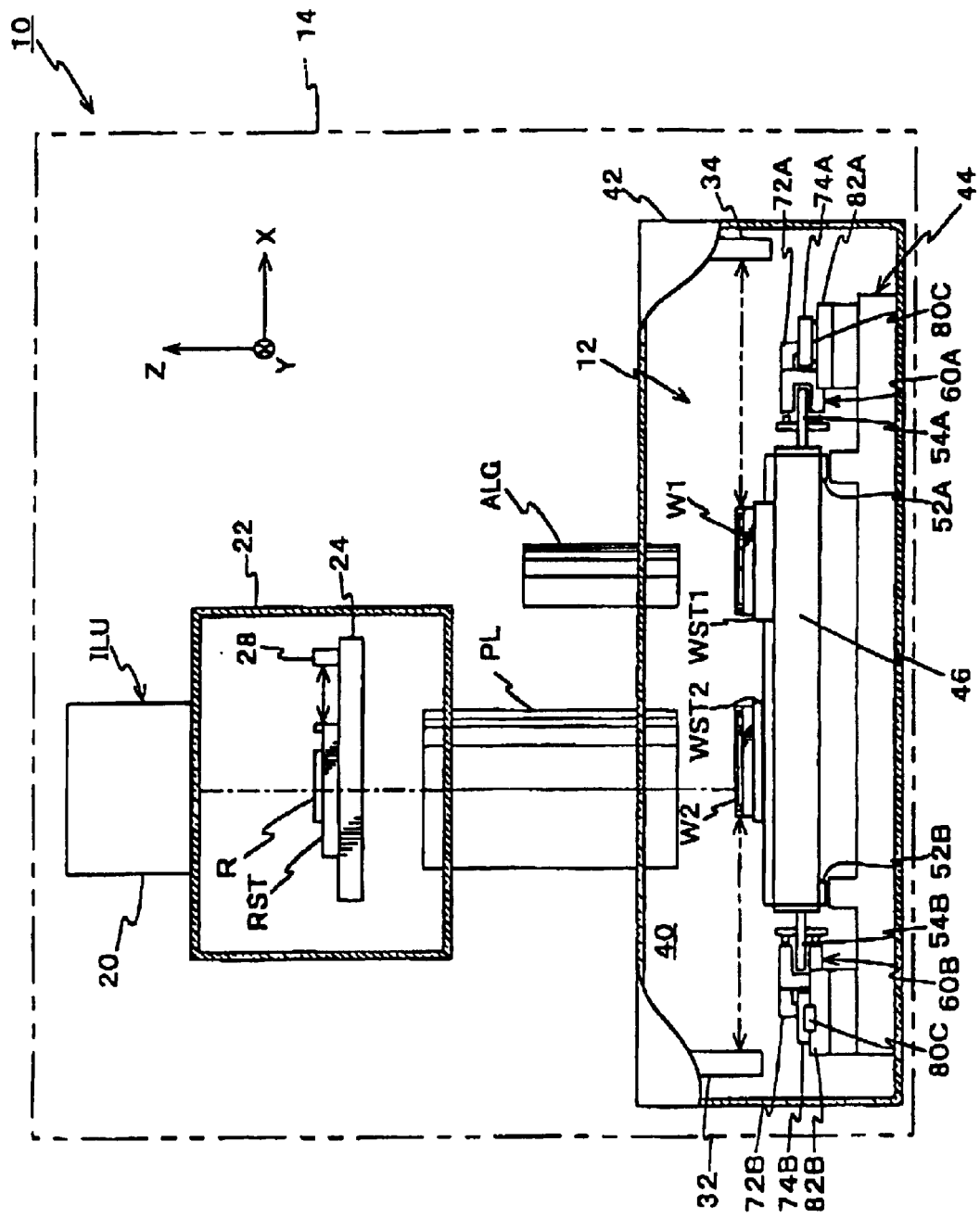
FIG. 1 is a general structural view of an exposure apparatus according to an embodiment of the present invention.

FIG. 1 shows the general configuration of an exposure apparatus 10 according to an embodiment of the present invention. The exposure apparatus 10 is a step-and-scan scanning exposure apparatus (a so-called "scanning stepper").

The exposure apparatus 10 comprises an illumination system, a reticle driving system, a projection optical system, and a stage device 12. The illumination system includes a light source (not shown) and an illumination unit ILU so as to illuminate a reticle R serving as a mask with illumination light for exposure serving as an energy beam from above. The reticle driving system is for driving the reticle R mainly in a predetermined scanning direction, that is, in the Y-axis direction (a direction orthogonal to the plane of FIG. 1). The projection optical system PL is placed below the reticle R. The stage device 12 is placed below the projection optical system PL and includes wafer stages WST1 and WST2 which hold wafers W1 and W2 serving as substrates and independently move in an XY two-dimensional plane.

The above components, excluding the light source, are housed in an environmental chamber (hereinafter simply referred to as a "a chamber") 14 installed on the floor of a superclean room, in which the temperature, humidity, and the like are precisely controlled.

Used as the light source is a pulsed laser light source, such as a $F_2$ laser light source (output wavelength of 157 nm) or an ArF excimer laser light source (output wavelength of 193 nm), which emits pulsed vacuum ultraviolet light. The light source is installed in another service room with a lower level of air cleanliness than that of the superclean room, where the chamber 14 is placed, or in a utility space under the floor of the superclean room, and is connected to the illumination unit ILU in the chamber 14 via a relay optical system (not shown).

Figure 7:
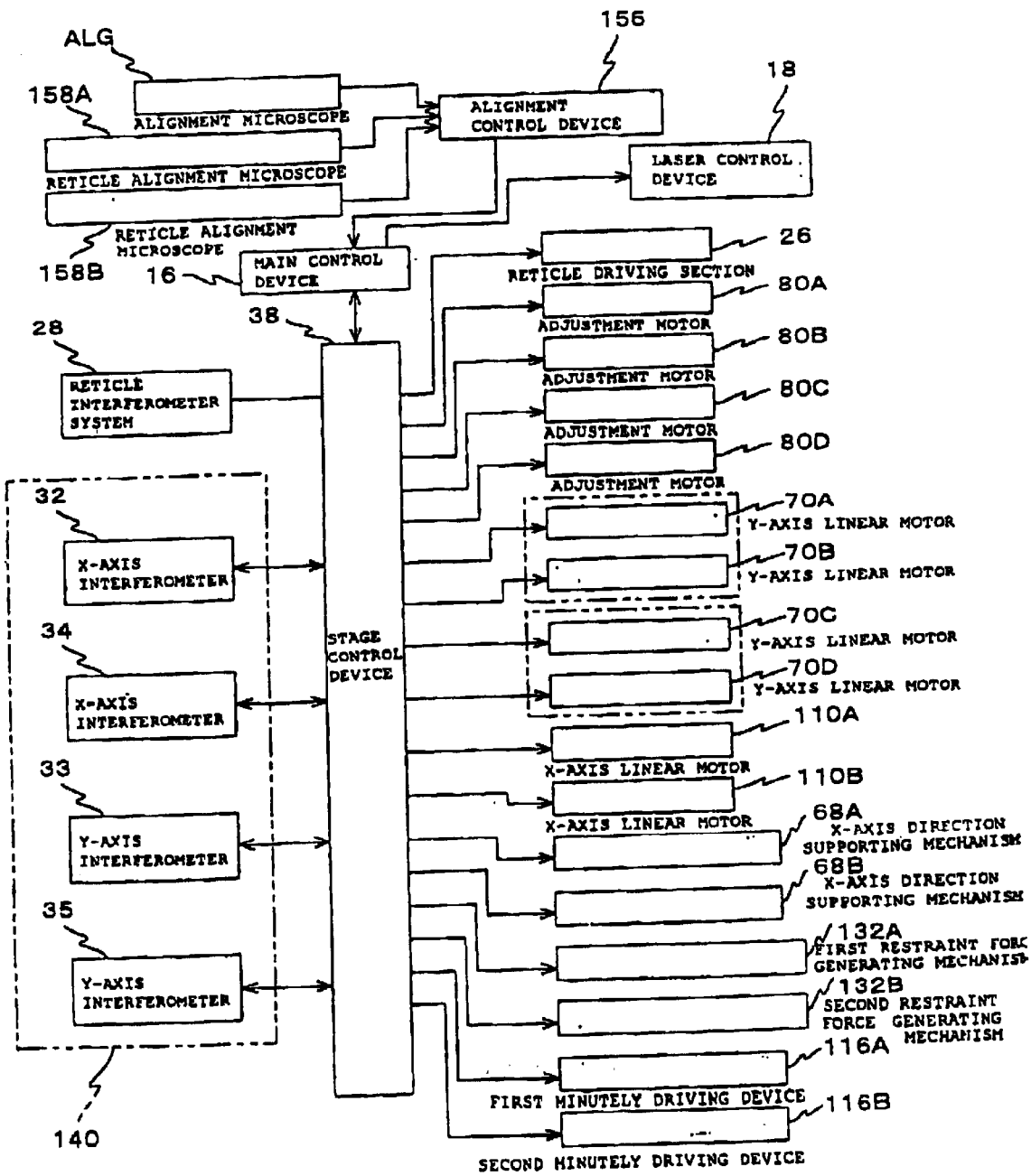
FIG. 7 is a block diagram showing the principal configuration of a control system of the exposure apparatus.

The repetition cycle (oscillatory frequency), pulse energy, and the like of pulsed light emitted from the light source are controlled by a laser control device 18 (not shown in FIG. 1, but shown in FIG. 7) under the control of a main control device 16 (shown in FIG. 1, but shown in FIG. 7).

An ultraviolet light source, such as a KrF excimer laser light source (output wavelength of 248 nm), or another vacuum ultraviolet light source, such as an $Ar_2$ laser light source (output wavelength of 126 nm), may be used as the light source.

The illumination unit ILU comprises an airtight illumination system housing 20, and an illumination optical system composed of a secondary light-source forming optical system (optical integrator), a beam splitter, a light-collecting lens system, a reticle blind, an imaging lens system, and the like (all not shown) which are placed in a predetermined positional relationship inside the illumination system housing 20. The illumination unit ILU illuminates a rectangular (or arcuate) illumination area IAR (see FIG. 2) on a reticle R at uniform illuminance. The illumination optical system has a structure similar to that disclosed in, for example, Japanese Unexamined Patent Application Publication No. 4-196513 and U.S. Pat. No. 5,473,410 corresponding thereto. U.S. Pat. No. 5,473,410 is incorporated herein by reference in its entirety.

The illumination system housing 20 is filled with clean helium gas (He) or dry nitrogen gas ($N_2$) having an air (oxygen) content of less than several parts per million.

The reticle driving system is housed in a reticle chamber 22 shown in FIG. 1. A light-transmitting window (not shown) made of fluorite or the like is formed at a connected portion between the reticle chamber 22 and the illumination system housing 20. The reticle chamber 22 is filled with clean helium gas (He) or dry nitrogen gas ($N_2$) having an air (oxygen) content of less than several parts per million.

The reticle driving system comprises a reticle stage RST that is movable in an X-Y two-dimensional plane on a reticle base plate 24 shown in FIG. 1 while holding a reticle R, a reticle driving section 26 (not shown in FIG. 1, but shown in FIG. 7) including a linear motor (not shown) so as to drive the reticle stage RST, and a reticle interferometer system 28 for controlling the position of the reticle stage RST.

More specifically, the reticle stage RST is composed of a reticle coarse-adjustment stage to be supportingly floated above the reticle base plate 24 via a non-contact bearing (not shown), for example, a vacuum preload hydrostatic gas bearing, and driven by a linear motor (not shown) within a predetermined stroke in the Y-axis direction serving as the scanning direction, and a reticle fine-adjustment stage, in contrast to the reticle coarse-adjustment stage, to be minutely driven in the X-axis direction, the Y-axis direction, and the $\theta_Z$ direction (direction of rotation about the Z-axis) by a driving mechanism having a voice coil motor and the like. A reticle R is held on the reticle coarse-adjustment stage via an electrostatic chuck or a vacuum chuck. In this embodiment, although not illustrated, a restraint force generating mechanism can be applied to the reticle stage RST. A reaction force produced due to the movement of the reticle coarse-adjustment stage is dealt with by moving a slider and stator of the linear motor for driving the reticle coarse-adjustment stage relative to the reticle base plate 24 in opposite directions, as disclosed in, for example, Japanese Unexamined Patent Application Publication No. 8-63231 and U.S. patent application Ser. No. 09/260,544 corresponding thereto. The disclosure of U.S. patent application Ser. No. 09/260,544 is incorporated herein by reference.

While the reticle stage RST is actually composed of two stages, as described above, it is assumed in the following description for convenience that the reticle stage RST is formed of a single stage to be driven by the reticle driving section 26 (not shown in FIG. 1, but shown in FIG. 7) so as to be minutely driven in the X-axis and Y-axis directions, to be minutely rotated in the $\theta_Z$ direction, and to be scanned in the Y-axis direction. While the reticle driving section 26 is a mechanism having a linear motor, a voice coil motor, or the like as a driving source, it is shown as a simple block in FIG. 7 for convenience of illustration.

Figure 2:
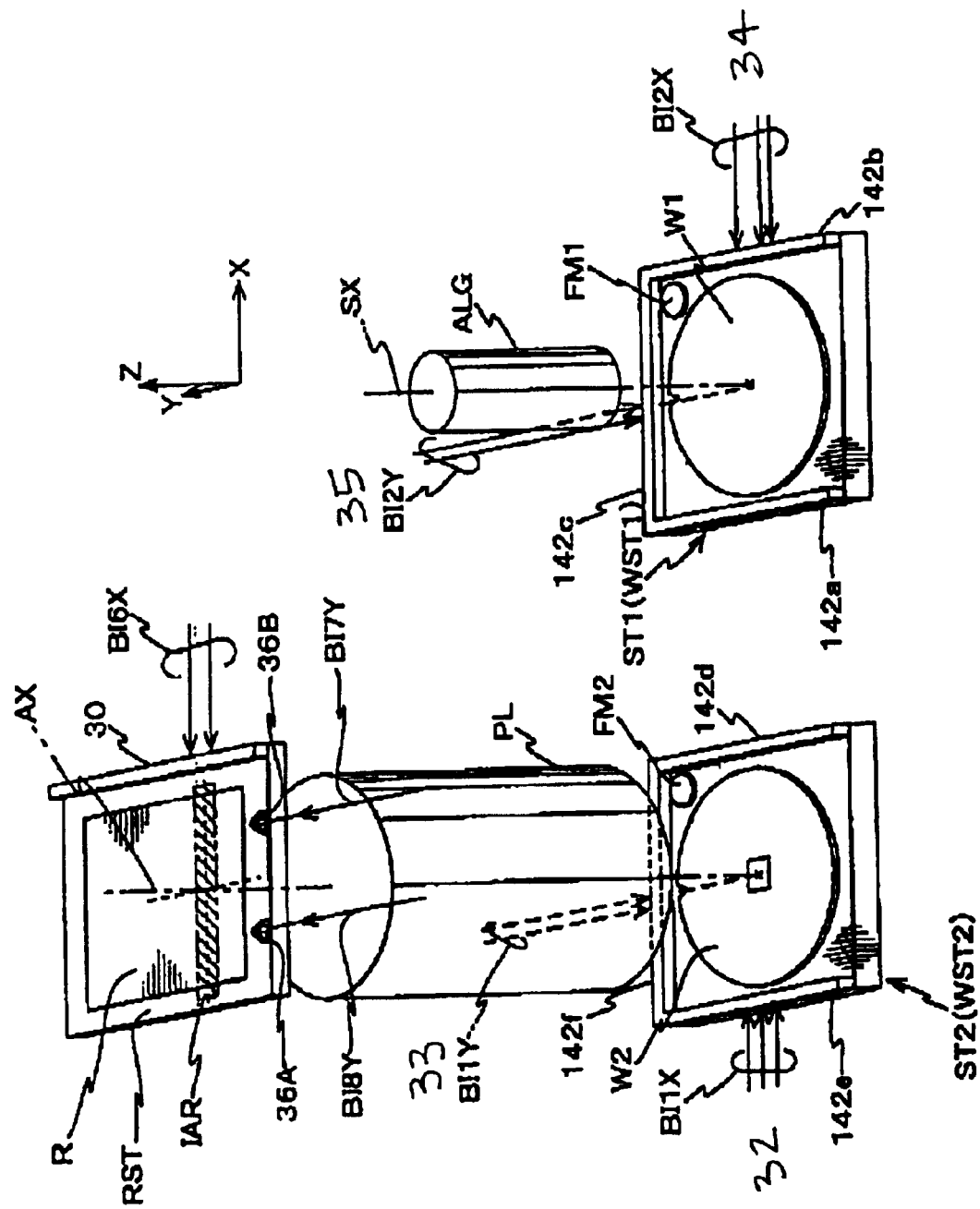
FIG. 2 is a perspective view showing the positional relationship among two wafer stages, a reticle stage, a projection optical system, and an alignment microscope.

As shown in FIG. 2, a planar movable mirror 30 made of the same material as that of the reticle stage RST (e.g., ceramic) extends in the Y-axis direction along one side of the reticle stage RST. One side face in the X-axis direction of the movable mirror 30 is mirror-finished to be a reflecting mirror. An interferometric beam is applied from an interferometer shown by a length measuring axis BI6X, which constitutes the reticle interferometer system 28 shown in FIG. 1, onto the reflecting surface of the movable mirror 30. The interferometer receives light reflected from the reflecting surface, and measures the displacement of the reticle stage RST relative to the reference plane so as to detect the position of the reticle stage RST. In reality, the interferometer having the length measuring axis BI6X has two interferometer optical axes which are capable of independent measurement, and can measure the position in the X-axis direction and the amount of yawing (amount of rotation in the $\theta_Z$ direction) of the reticle stage RST. The interferometer having the length measuring axis BI6X serves to control the rotation of the reticle stage RST in such a way as to cancel the relative rotation (rotational errors) of the reticle and the wafer, based on information about yawing and the X-axis position of the wafer stages WST1 and WST2 from X-axis interferometers 32 and 34 having length measuring axes BI1X and BI2X and placed on the sides of the wafer stages, which will be described later, and to perform synchronous control (alignment) in the X-axis direction.

In contrast, a pair of corner-cube mirrors 36A and 36B is disposed on one side of the reticle stage RST in the Y-axis direction serving as the scanning direction. Interferometric beams shown by length measuring axes BI7Y and BI8Y shown in FIG. 2 are applied from a pair of double-pass interferometers (not shown) onto the corner-cube mirrors 36A and 36B, and are returned to reflecting surfaces (not shown) formed on the reticle base plate 24 by the corner-cube mirrors 36A and 36B. Lights reflected therefrom trace the same optical paths and are reflected by the double-pass interferometers, whereby the relative displacement from the reference positions (the reflecting surface of the reticle base plate 24) of the corner-cube mirrors 36A and 36B is measured. The values measured by the double-pass interferometers are supplied to a stage control device 38 (not shown in FIG. 1, but shown in FIG. 7), and the position in the Y-axis direction of the reticle stage RST is detected based on the average of the values. Information about the position in the Y-axis direction is used to calculate the relative positions of the reticle stage RST and the wafer stage WST1 or WST2 based on a value measured by an interferometer having a length measuring axis BI1Y (see FIG. 2), which will be described later, and to control the synchronization between the reticle and the wafer in the scanning direction (Y-axis direction) during scan-exposure base on the relative positions.

That is, in this embodiment, the interferometer shown by the length measuring axis BI6X and the double-pass interferometers shown by the length measuring axes BI7Y and BI8Y constitute the reticle interferometer system 28.

The material of a glass substrate forming the reticle R should be varied depending on the type of light source to be used. For example, in a case in which a vacuum ultraviolet light source, such as a $F_2$ laser light source, is used as the light source, it is preferable to use fluoride crystal, such as fluorite, magnesium fluoride, or lithium fluoride, or synthetic quartz (fluorine-doped quartz) having a hydroxyl content of 100 ppm or less and containing fluorine. In a case in which an ArF excimer laser light source or a KrF excimer laser light source is used, synthetic quartz may be used.

Referring again to FIG. 1, the projection optical system PL is joined to the reticle chamber 22 near the top of a barrel thereof without any space therebetween. In this embodiment, the projection optical system PL is a reduction system that is telecentric on both the object (reticle) side and the image plane (wafer) side and has a reduction ratio of 1/4 (or 1/5). For this reason, when illumination light (pulsed ultraviolet light) is applied from the illumination unit ILU onto the reticle R, an imaging light beam emitted from a portion of a circuit pattern area on the reticle R, which is illuminated with the pulsed ultraviolet light, enters the projection optical system PL. Every time pulsed ultraviolet light is applied, a partial inverted image of the circuit pattern is formed in a slit-like or rectangular (polygonal) shape at the center of the visual field of the projection optical system PL on the side of the image plane. The projected partial inverted image of the circuit pattern is reduced and transferred onto a resist layer on one of the shot areas on the wafer placed in the image plane of the projection optical system PL.

In a case in which an ArF excimer laser light source or a KrF excimer laser light source is used, the projection optical system PL is principally formed of a refracting system consisting of a refracting optical element (lens element). In a case in which a $F_2$ laser light source, an $Ar_2$ laser light source, or the like is used, a so-called catadioptric system (reflecting and refracting system) composed of a refracting optical element and a reflecting optical element in combination, or a reflecting optical system consisting of a reflecting optical element is principally used. A refracting system may also be used when a $F_2$ laser light source is used.

The material of lenses (glass materials) constituting the projection optical system PL should be varied depending on the type of light source to be used. While the lenses may be made of both synthetic quartz and fluorite when an ArF excimer laser light source or a KrF excimer laser light source is used, all the lenses must be made of fluorite when a vacuum ultraviolet light source, such as a $F_2$ laser light source, is used.

In this embodiment, the barrel of the projection optical system PL is filled with clean helium gas (He) or dry nitrogen gas ($N_2$) having an air (oxygen) content of less than several parts per million.

The stage device 12 is placed inside a wafer chamber 42 having a wafer space 40 therein, as shown in FIG. 1. The upper wall of the wafer chamber 42 is joined to the adjacency of the bottom of the barrel of the projection optical system PL without any space therebetween.

Figure 3:
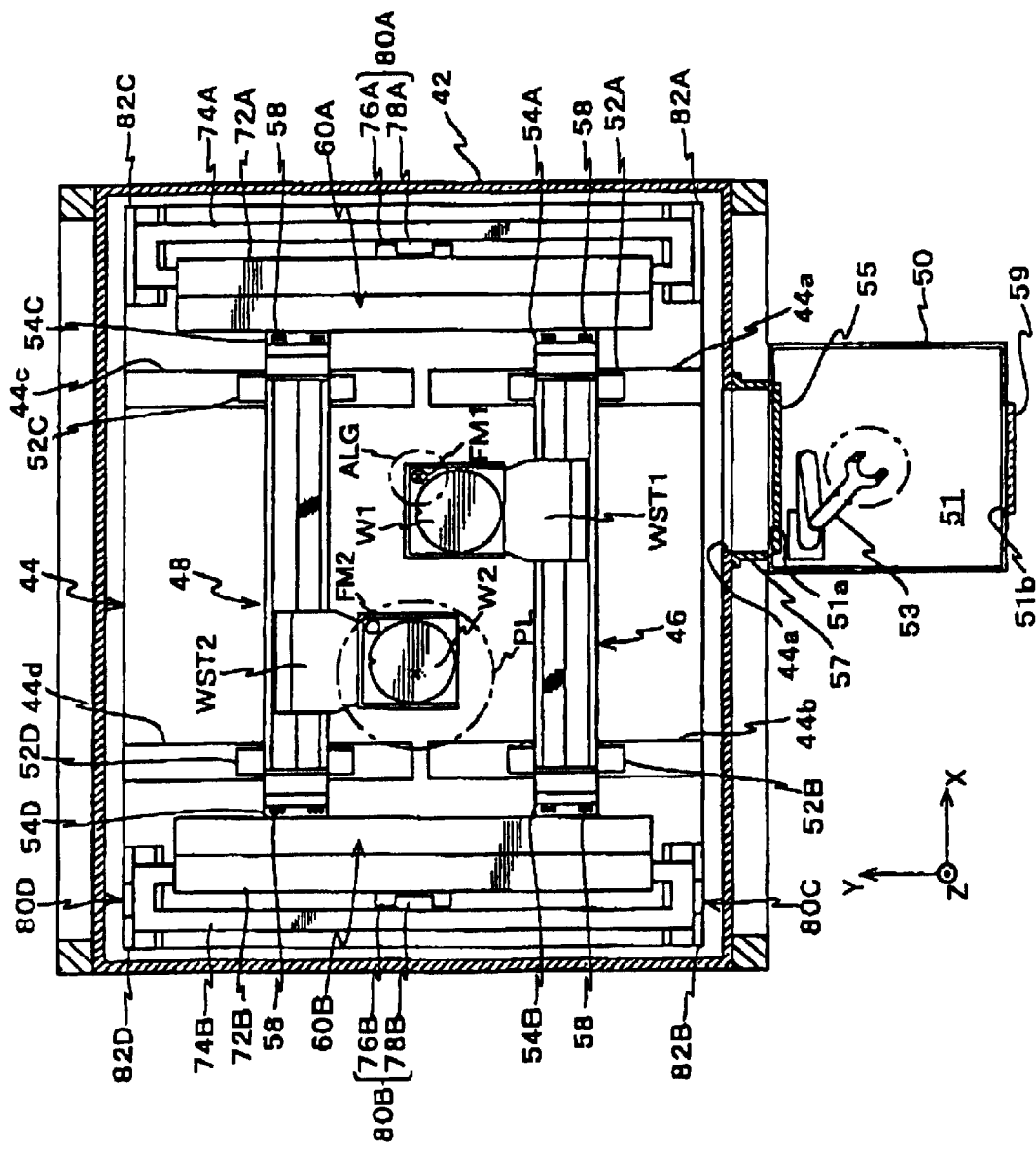
FIG. 3 is a sectional plan view of a wafer chamber and a wafer loader chamber, as viewed from above.

The stage device 12 comprises a base plate 44 horizontally placed inside the wafer space 40, a first guide bar 46 and a second guide bar 48 (not shown in FIG. 1, but shown in FIG. 3) supportingly floated above the upper surface of the base plate 44 so as to move in the Y-axis direction, wafer stages WST1 and WST2 movable in the X-axis direction along the first and second guide bars 46 and 48, driving devices for the above components, and the like (see FIG. 3).

Figure 4:
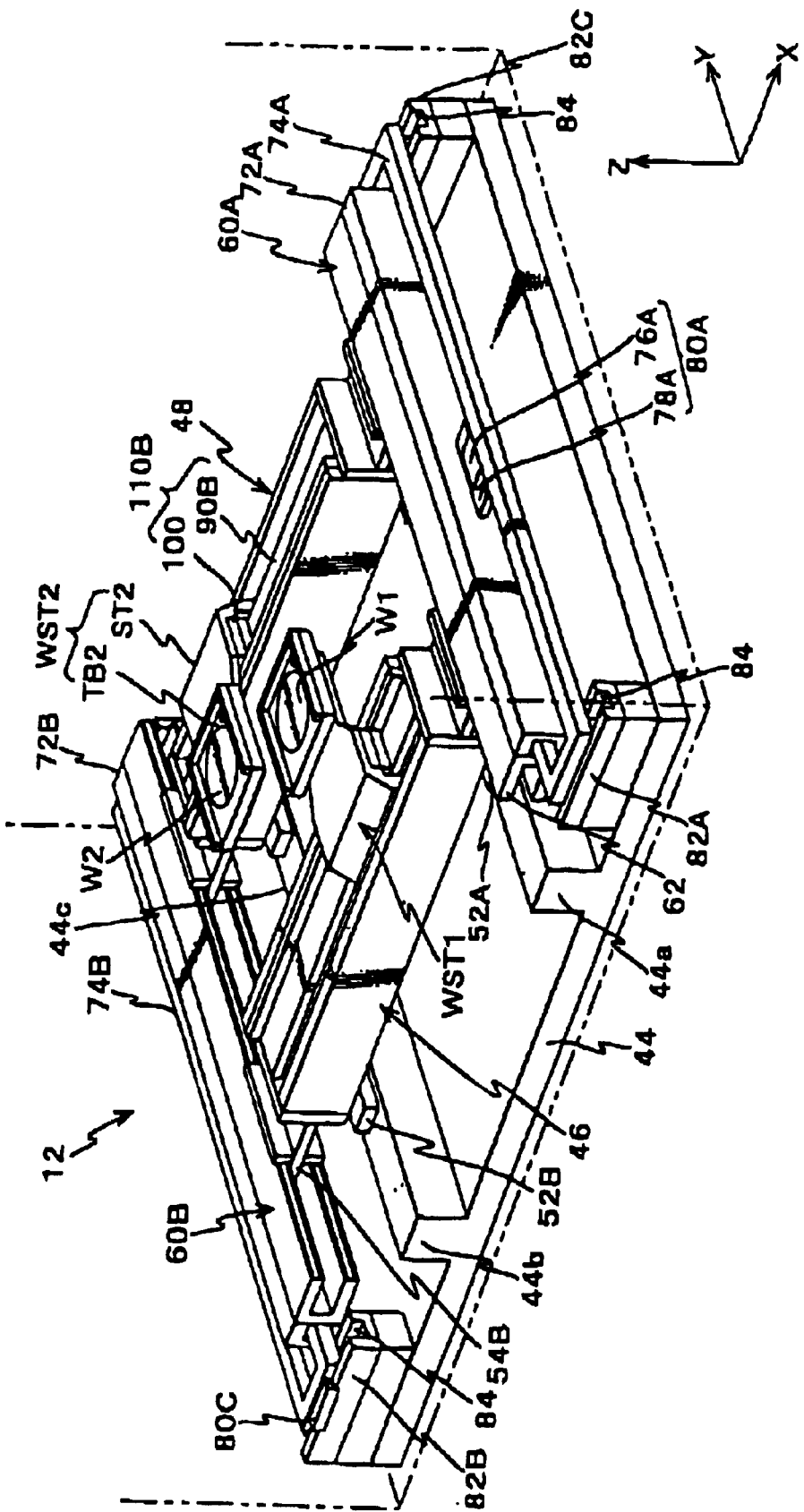
FIG. 4 is a general perspective view of a stage device housed in the wafer chamber.
Figure 5:
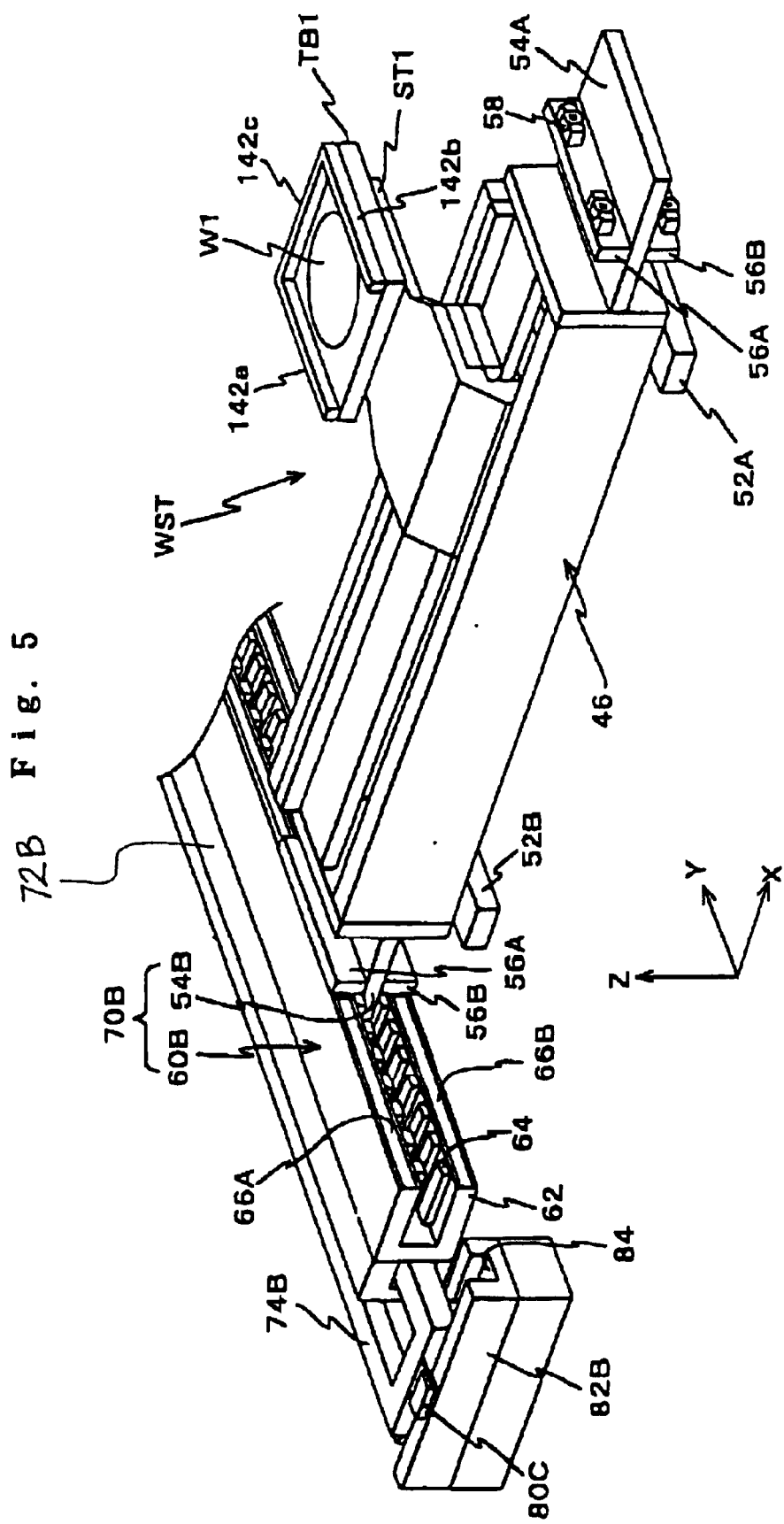
FIG. 5 is an enlarged view of a part of the stage device shown in FIG. 4.

FIG. 3 is a sectional plan view of the wafer chamber 42 and a wafer loader chamber 50, which will be described later, as viewed from above, FIG. 4 is a general perspective view of the stage device 12 housed in the wafer chamber 42, and FIG. 5 is an enlarged view of a part of the stage device 12 shown in FIG. 4. The components of the stage device 12 will be described below in detail mainly with reference to FIGS. 3, 4, and 5, and appropriately with reference to other figures.

The base plate 44 is, as shown in FIGS. 3 and 4, horizontally placed on the inner bottom surface of the wafer chamber 42. Four ribs 44a, 44b, 44c, and 44d of a predetermined length are formed integrally with the upper surface of the base plate 44 so as to extend in the Y-axis direction, as shown in FIGS. 3 and 4. The ribs 44a and 44b are arranged symmetrically with respect to the Y-axis (more specifically, with respect to the YZ plane) passing through the center of the base plate 44. The ribs 44c and 44d are similarly arranged. The ribs 44a and 44c are arranged symmetrically with respect to the X-axis (more specifically, with respect to the XZ plane) passing through the center of the base plate 44. The ribs 44b and 44d are similarly arranged. The upper surfaces of the four ribs 44a to 44d are surface-finished to be guide surfaces having a substantially high flatness. Hereinafter, the ribs 44a to 44d will be referred to as "Z-axis guides".

On the bottom surfaces of the portions of the first guide bar 46 adjacent to both ends in the longitudinal direction (X-axis direction), non-contact supporting mechanisms 52A and 52B are fixed so as to supportingly float the first guide bar 46 above the Z-axis guides 44a and 44b in a non-contact manner. The non-contact supporting mechanisms 52A and 52B are each composed of a bearing mounting member and a plurality of hydrostatic gas bearings fixed on the bottom surface of the bearing mounting member.

As shown in FIG. 5, an armature unit 54A in the shape of a flat plate of a predetermined thickness is fixed at one end (+X-side end) of the first guide bar 46 in the longitudinal direction so as to be in parallel with the XY plane. The armature unit 54A has therein a plurality of armature coils (not shown) arranged at regular intervals in the Y-axis direction. A pair of upper and lower magnet mounting members 56A and 56B are integrally fixed to the armature unit 54A so as to be disposed orthogonal to the armature unit 54A and in parallel with the YZ plane. A pair of electromagnets 58 is fixed on the outer surface (+X-side face) of each of the magnet mounting members 56A and 56B so as to be arranged at a predetermined interval in the Y-axis direction, that is, four electromagnets 58 are fixed in total.

An armature unit 54B having a structure similar to that of the armature unit 54A is similarly fixed to the other end (−X-side end) of the first guide bar 46 in the longitudinal direction. A pair of magnet mounting portions 56A and 56B is similarly fixed integrally with the armature unit 54B. A pair of electromagnets 58 is fixed on the outer surface (−X-side face) of each of the magnet mounting members 56A and 56B so as to be arranged at a predetermined interval in the Y-axis direction, that is, four electromagnets 58 are fixed in total (see FIG. 3).

In the stage device 12, a magnetic pole unit 60B extends in the Y-axis direction so as to enclose the leading end of one of the armature units 54B from above and below. The magnetic pole unit 60B includes, as shown in FIG. 5, a yoke 62 having a U-shaped XZ cross section, and a plurality of permanent magnets 64 arranged in the Y-axis direction at predetermined intervals on the upper and lower opposing faces of the yoke 62. In this case, an alternating magnetic field is formed in the Y-axis direction in the inner space of the yoke 62. Band-shaped iron plates 66A and 66B extending in the Y-axis direction are fixed on upper and lower +X-side faces of the yoke 62. The two electromagnets 58 are opposed to each of the iron plates 66A and 66B.

The four electromagnets 58 are thus provided on the side of the armature unit 54B for the following reason.

For example, yawing of the first guide bar 46 can be controlled by making a difference between magnetic attraction forces of the electromagnets 58 adjoining in the Y-axis direction. Furthermore, rolling ($\theta_Y$ rotation) of the first guide bar 46 can be controlled by making a difference between magnetic attraction forces of the electromagnets 58 adjoining in the vertical direction. A −X-direction force can be applied to the first guide bar 46 by setting the magnetic attraction forces of all the four electromagnets 58 at the same value.

A magnetic pole unit 60A extends in the Y-axis direction so as to enclose the leading end of the other armature unit 54A from above and below. The magnetic pole unit 60A has a structure similar to that of the magnetic pole unit 60B. In this case, an alternating magnetic field is also formed in the Y-axis direction in the inner space of a yoke 62 (see FIG. 4) of the magnetic pole unit 60A. Iron plates (not shown) extending in the Y-axis direction are fixed on upper and lower −X-side faces of the yoke 62, and two electromagnets 58 are opposed to each of the iron plates (see FIG. 3). Since the armature unit 54A is also provided with four electromagnets 58 in a manner similar to the above, it can control yawing and rolling of the first guide bar 46. In this case, a +X-direction force can be applied to the first guide bar 46 by setting magnetic attraction forces of all the four electromagnets 58 at the same value. Therefore, the first guide bar 46 can be supported at a predetermined X-axis position in a non-contact manner by appropriately adjusting the magnetic attraction forces of the four electromagnets 58 in the armature unit 54A and the magnetic attraction forces of the four electromagnets 58 in the armature unit 54B.

That is, the four electromagnets 58 of the armature unit 54A, the four electromagnets 58 of the armature unit 54B, the iron plates 66A and 66B opposed to the electromagnets 58, and the like constitute an X-direction supporting mechanism 68A (see FIG. 7) for supporting the first guide bar 46 at a predetermined X-axis position in a non-contact manner.

The armature unit 54A and the magnetic pole unit 60A opposed thereto constitute a moving coil type Y-axis linear motor 70A (see FIG. 7) for generating driving force (Lorentz force) in the Y-axis direction by an electromagnetic interaction therebetween. The armature unit 54B and the magnetic pole unit 60B opposed thereto constitute a moving coil type Y-axis linear motor 70B (see FIGS. 5 and 7) for generating driving force (Lorentz force) in the Y-axis direction by an electromagnetic interaction therebetween.

As shown in FIGS. 3 and 4, a movable guide 72A having a U-shaped XZ cross section and extending in the Y-axis direction is fixed integrally with a back face (+X-side face) of the magnetic pole unit 60A. The movable guide 72A is supported in a non-contact manner by a fixed guide 74A shaped like an elongated rectangular frame, as viewed from above, via a non-contact bearing (not shown) such as a hydrostatic gas bearing. That is, the movable guide 72A is movable in the Y-axis direction along the fixed guide 74A together with the magnetic pole unit 60A. A slider 76A of a voice coil motor protrudes from about the center in the longitudinal direction of the back face of the movable guide 72A. A stator 78A is fixed to a portion of the fixed guide 74A opposed thereto so as to clamp the slider 76A from above and below in a non-contact manner. In this case, the slider 76A and the stator 78A constitute an adjustment motor 80A (see FIG. 7) for driving the movable guide 72A and the magnetic pole unit 60A along the fixed guide 74A and placing the movable guide 72A and the magnetic pole unit 60A into a predetermined Y-axis position.

Both ends in the longitudinal direction (Y-axis direction) of the fixed guide 74A are supported above a pair of guide members 82A and 82C fixed on the base plate 44. As shown in FIG. 4, each of the guide members 82A and 82C has, on its upper surface, a guide groove 84 extending in the X-axis direction. Ribs to be engaged with the guide grooves 84 are formed on the lower surfaces at both ends in the longitudinal direction (Y-axis direction) of the fixed guide 74A. That is, the fixed guide 74A is allowed to move in the X-axis direction along the guide grooves 84 of the guide members 82A and 82C.

A movable guide 72B having a U-shaped XZ cross section and extending in the Y-direction is fixed integrally with the back face (−X-side face) of the magnetic pole unit 60B, as shown in FIGS. 3 and 4. The movable guide 72B is supported in a non-contact manner by a fixed guide 74B shaped like an elongated rectangular frame, as viewed from above, via a non-contact bearing (not shown) such as a hydrostatic gas bearing. That is, the movable guide 72B is movable in the Y-axis direction along the fixed guide 74B together with the magnetic pole unit 60B. A slider 76B of a voice coil motor protrudes from about the center in the longitudinal direction of the back face of the movable guide 72B. A stator 78B is fixed to a portion of the fixed guide 74B opposed thereto so as to clamp the slider 76B from above and below in a non-contact manner. The slider 76B and the stator 78B constitute an adjustment motor 80B (see FIG. 7) for driving the movable guide 72B and the magnetic pole unit 60B along the fixed guide 74B and placing the movable guide 72B and the magnetic pole unit 60B into a predetermined Y-axis position.

Both ends in the longitudinal direction (Y-axis direction) of the fixed guide 74B are supported above a pair of guide members 82B and 82D fixed on the base plate 44. Each of the guide members 82B and 82D has, on its upper surface, a guide groove 84 extending in the X-axis (see FIG. 4). Ribs to be engaged with the guide grooves 84 are formed on the lower surfaces at both ends in the longitudinal direction (Y-axis direction) of the fixed guide 74B. That is, the fixed guide 74B is allowed to move in the X-axis direction along the guide grooves 84 of the guide members 82B and 82D. Furthermore, a pair of adjustment motors 80C and 80D are disposed between the guide members 82B and 82D and both ends in the longitudinal direction of the fixed guide 74B so as to generally move the movable guide 72B, the magnetic pole unit 60B, the first and second guide bars 46 and 48, the magnetic pole unit 60A, the movable guide 72A, and the like in the X-axis direction via the fixed guide 74B.

As shown in FIG. 3, non-contact supporting mechanisms 52C and 52D are fixed on the bottom surface adjacent to both ends in the longitudinal direction (X-axis direction) of the second guide bar 48 so as to supportingly float the second guide bar 48 above the Z-axis guides 44c and 44d in a non-contact manner. The non-contact supporting mechanisms 52C and 52D have a structure similar to those of the above-described non-contact supporting mechanisms 52A and 52B.

An armature unit 54C having a structure similar to that of the armature unit 54A is disposed at one end (+X-side end) in the longitudinal direction of the second guide bar 48, as shown in FIG. 3. Four electromagnets 58 are fixed to the armature unit 54C via a pair of upper and lower magnet mounting members arranged orthogonal to the armature unit 54C and in parallel with the YZ plane.

An armature unit 54D having a structure similar to that of the armature unit 54A is fixed at the other end (−X-side end) in the longitudinal direction of the second guide bar 48. Four electromagnets 58 are similarly fixed to the armature unit 54D via a pair of upper and lower magnet mounting members.

In this case, the armature unit 54D is enclosed by the magnetic pole unit 60B from above and below while each two of the electromagnets 58 fixed to the armature unit 54D face the iron plates 66A and 66B disposed on the +X-side face of the yoke 62 in the magnetic unit 60B. Similarly, the armature unit 54C is enclosed by the magnetic pole unit 60A from above and below while each two of the electromagnets 58 fixed to the armature unit 54C face the iron plates (not shown) disposed on the −X-side face of the yoke 62.

Since each of the armature units 54C and 54D thus has the four electromagnets 58, it is able to control yawing and rolling of the second guide bar 48, in a manner similar to the above. In this case, a +X-direction force can be applied to the second guide bar 48 by setting magnetic attraction forces of all the four electromagnets 58 of the armature unit 54C at the same value. Similarly, a −X-direction force can be applied to the second guide bar 48 by setting the magnetic attraction forces of all the four electromagnets 58 of the armature unit 54D at the same value. Accordingly, the second guide bar 48 can be supported at a predetermined X-axis position in a non-contact manner by appropriately adjusting the magnetic attraction forces of the electromagnets 58 of the armature unit 54C and the magnetic attraction forces of the electromagnets 58 of the armature unit 54D.

That is, the four electromagnets 58 of the armature unit 54C, the four electromagnets 58 of the armature unit 54D, and the iron plates 66A and 66B opposing the electromagnets 58, and the like constitute an X-axis direction supporting mechanism 68B (see FIG. 7) for supporting the second guide bar 48 at a predetermined X-axis position in a non-contact manner.

The armature unit 54C and the magnetic pole unit 60A opposed thereto constitute a moving coil type Y-axis linear motor 70C (see FIG. 7) for generating driving force (Lorentz force) in the Y-axis direction by an electromagnetic interaction therebetween, and the armature unit 54D and the magnetic pole unit 60B opposed thereto constitute a moving coil type Y-axis linear motor 70D (see FIGS. 5 and 7) for generating driving force (Lorentz force) in the Y-axis direction by an electromagnetic interaction therebetween. The second guide bar 48 is driven in the Y-axis direction by the two Y-axis linear motors 70C and 70D. In this embodiment, the Y-axis linear motors 70C and 70D and the above-described Y-axis linear motors 70A and 70B for driving the first guide bar 46 in the Y-axis direction constitute a third driving device for independently driving the first and second guide bars 46 and 48 in the Y-axis direction.

Referring to FIG. 5, the first guide bar 46 is provided with the wafer stage WST1 that is movable along the first guide bar 46 in the X-axis direction. The wafer stage WST1 includes a stage body ST1 serving as a first stage, a substrate table TB1 supportingly floated above the stage body ST1 in a non-contact manner, and the like.

Figure 6A:
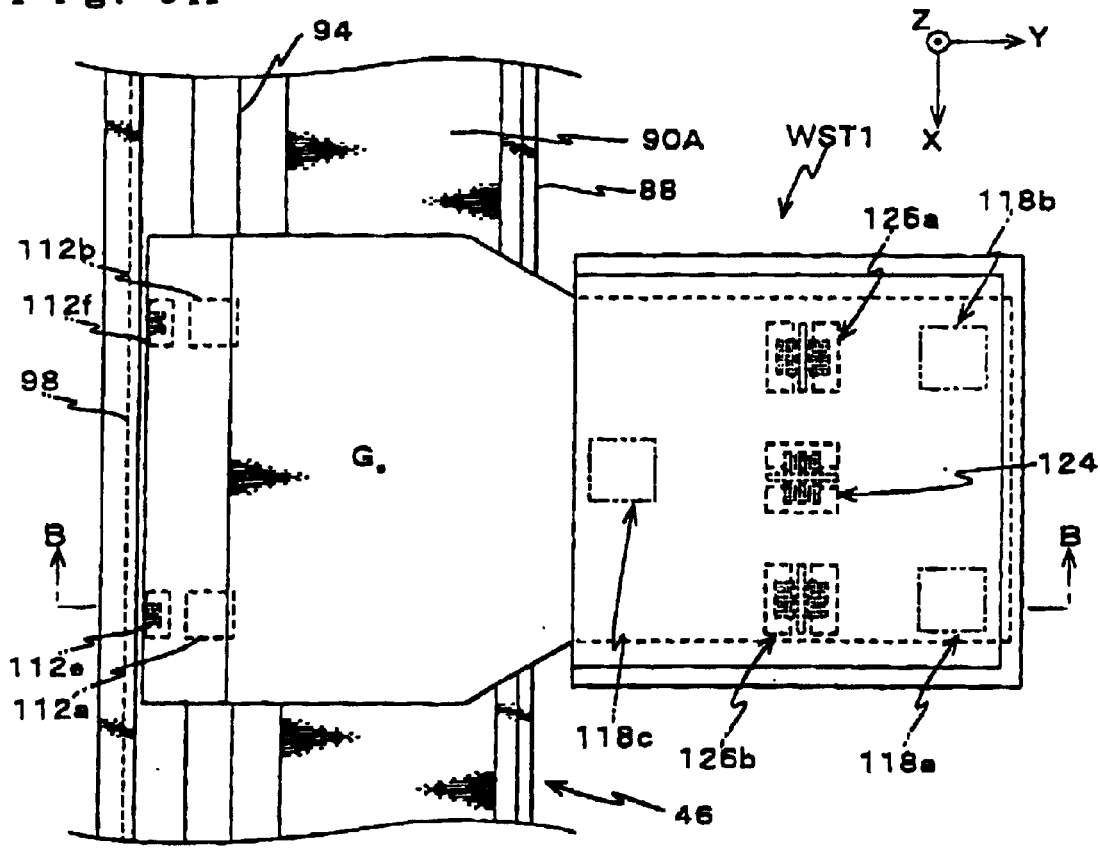
FIG. 6A is a general plan view of one of the wafer stages and its surroundings.
Figure 6B:
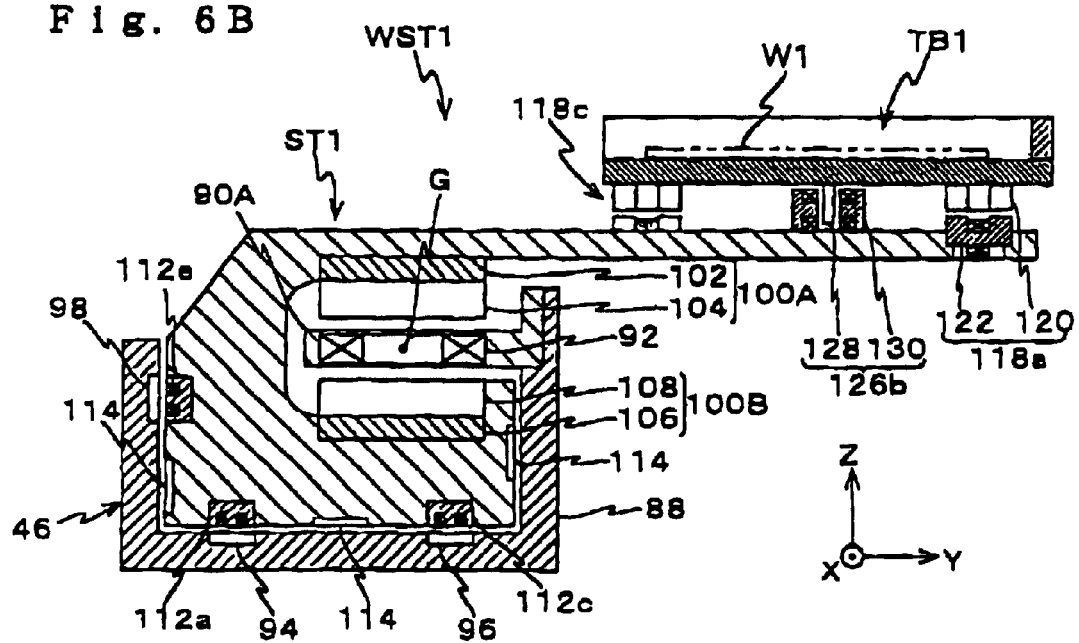
FIG. 6B is a cross-sectional view, taken along line B—B in FIG. 6A.

FIG. 6A is a general plan view of the wafer stage WST1 and its surroundings, and FIG. 6B is a cross-sectional view, taken along line B—B in FIG. 6A. As shown in FIGS. 6A and 6B, the first guide bar 46 includes a guide bar body 88 having a nearly U-shaped YZ cross section and extending in the X-axis direction serving as a first direction, and an armature unit 90A serving as a first stationary member fixed on the +Y-side wall of the guide bar body 88. The armature unit 90A is cantilevered nearly parallel to the bottom surface of the guide bar body 88 so as to extend in the longitudinal direction of the guide bar body 88. Inside the armature unit 90A, a plurality of armature coils 92 are arranged at predetermined intervals in the X-axis direction.

Iron plates 94 and 96 extending in the X-axis direction are embedded in the inner bottom surface of the guide bar body 88 at a predetermined interval in the Y-axis direction. An iron plate 98 extending in the X-axis direction is also embedded adjacent to the top of the −Y-side inner side wall of the guide bar body 88.

In contrast, the stage body ST1 of the wafer stage WST1 has a YZ cross section nearly shaped like a Greek character "σ", as shown in FIG. 6B. A portion of the stage body ST1 placed at an upper position than the first guide bar 46 in the direction of center of gravity (Z-axis direction) protrudes toward one side (−Y-side) in the Y-axis direction serving as a second direction, and the other-side end (−Y-side end) in the Y-axis direction is supported by the first guide bar 46. The stage body ST1 is also provided with a pair of magnetic pole units 100A and 100B placed with the armature unit 90 therebetween. The magnetic pole unit 100A includes a magnetic member 102 of a predetermined length fixed to the stage body ST1 so as to face the upper surface of the armature unit 90A and to extend in the X-axis direction, and a plurality of permanent magnets 104 arranged at predetermined intervals in the X-axis direction on the lower surface (−Z-side face) of the magnetic member 102. The magnetic pole unit 100E includes a magnetic member 106 of a predetermined length fixed to the stage body ST1 so as to face the lower surface of the armature unit 90A and to extend in the X-axis direction, and a plurality of permanent magnets 104 arranged at predetermined intervals in the X-axis direction on the upper surface (+Z-side face) of the magnetic member 106. In this case, an alternating magnetic field is formed in the X-axis direction in a space between the magnetic members 102 and 106. Therefore, when current is supplied to the armature coils 92 of the armature unit 90, Lorentz force in the +X-direction or in the −X-axis direction is produced in the armature coils 92 by an electromagnetic interaction, and reaction force against the Lorentz force drives the stage body ST1 in the −X-axis direction or in the +X-axis direction.

That is, the magnetic pole units 100A and 100B constitute a first moving member for generating driving force in the X-axis direction by an electromagnetic interaction with the armature unit 90A, and the first moving member and the armature unit 90A constitute an X-axis linear motor 110A (see FIG. 7) serving as a first driving device for driving the stage body ST1 in the X-axis direction.

In this case, the point of action of the driving direction in the X-axis direction is set at the center of gravity G of the wafer stage WST1 shown in FIGS. 6A and 6B. For this reason, it is possible to effectively restrain the wafer stage WST1 from yawing (rotating on the Z-axis) and rolling (rotating on the Y-axis) when being driven in the X-axis direction.

On the inner bottom surface of the stage body ST1, two electromagnets 112a and 112b are placed opposed to the iron plate 94, and two electromagnets 112c and 112d are placed opposed to the iron plate 96 (the electromagnet 112d is not shown), that is, four electromagnets are placed in total. As shown in FIG. 6A, the electromagnets 112a and 112b are symmetrically placed with respect to the YZ plane passing through the center of gravity G. Although not shown in FIG. 6A, the electromagnets 112c and 112d are also symmetrically placed with respect to the YZ plane passing through the center of gravity G. The electromagnets 112a and 112c are arranged at a predetermined interval in a direction parallel to the Y-axis direction, as shown in FIG. 6B. Although not shown in FIG. 6B, the electromagnets 112b and 112d are also arranged at a predetermined interval in the direction parallel to the Y-axis direction. Moreover, electromagnets 112e and 112f are disposed on the −Y-side face of the stage body ST1 so as to face the above-described iron plate 98. The electromagnets 112e and 112f are symmetrically placed with respect to the YZ plane passing through the center of gravity G.

At least two hydrostatic gas bearings 114 are arranged at a predetermined interval in the X-axis direction on each of the +Y-side face, the −Y-side face, and the bottom face of the stage body ST1 opposed to the guide bar body 88. The stage body ST1 (a −Y-side portion thereof) is supported by the first guide bar 46 in a non-contact manner by static pressure of compressed gas (e.g., nitrogen or helium) jetted from the hydrostatic gas bearings 114.

The substrate table TB1 serving as a first table is supportingly floated above the protruding portion of the stage body ST1 on the +Y-side. More specifically, a first minutely driving device 116A (see FIG. 7) is provided between the substrate table TB1 and the stage body ST1 so as to minutely drive the substrate table TB1 relative to the stage body ST1 in six degree-of-freedom directions, X, Y, Z, $\theta_X$, $\theta_Y$, and $\theta_Z$. That is, the substrate table TB1 is supported in a non-contact manner by three Z-driving mechanisms 118a to 118c placed at three different positions corresponding to vertices of a triangle, as shown in FIG. 6A. One of the Z-driving mechanisms 118a is, as shown in FIG. 6B, composed of a magnetic unit 120 fixed on the bottom surface of the substrate table TB1, and an electromagnet 122 disposed on the stable body ST1 so as to face the magnetic unit 120 and to generate magnetic repulsive force for the magnetic unit 120. The other Z-driving mechanisms 118b and 118c also have the structure similar to that of the Z-driving mechanism 118a. Accordingly, the substrate table TB1 can be minutely driven in the Z, $\theta_X$, and $\theta_Y$ directions by adjusting magnetic forces generated from the electromagnets 122 of the Z driving mechanisms 118a to 118c.

As shown in FIG. 6A, the substrate table TB1 is minutely driven in the X-axis direction by an X minutely driving mechanism 124 placed at the center of the substrate table TB1, and is minutely driven in the Y-axis direction by a pair of Y minutely driving mechanisms 126a and 126b placed on both sides of the X minutely driving mechanism 124 in the X-axis direction. The substrate table TB1 can be minutely driven in the $\theta_Z$ direction by making a difference between driving forces generated by the Y minutely driving mechanisms 126a and 126b. The Y minutely driving mechanism 126b is, as shown in FIG. 6B, composed of an iron plate 128 protruding from the bottom surface of the substrate table TB1, and a pair of electromagnets 130 placed on both sides of the iron plate 128 and fixed to the stage body ST1. The Y minutely driving mechanism 126a has a structure similar to that of the Y minutely driving mechanism 126b. The X minutely driving mechanism 124 also has a structure similar to that of the Y minutely driving mechanism 126b except that the orientation thereof is shifted by 90°.

In this embodiment, when any of the Z-driving mechanisms 118a to 118c of the first minutely driving device 116A is driven for the purpose of focusing and leveling of the substrate table TB1, reaction force against the driving force acts on the stage body ST1. In this case, if all the electromagnets 112a to 112f are not activated, the stage body ST1 is minutely rotated on the center of gravity G in the clockwise direction in FIG. 6 by the action of the reaction force. The amount of rotation of the stage body ST1 is set so as to absorb the reaction force, that is, to maintain the angular momentum on the center of gravity G of the system including the wafer table TB1 and the stage body ST1.

In contrast, when at least one of the electromagnets 112a to 112f generates magnetic attraction force, the clockwise rotation of the stage body ST1 is restrained. In particular, when all the electromagnets 112a to 112f generate magnetic attraction forces, the stage body ST1 is completely prevented from rotating on the center of gravity G even when the reaction force acts thereon.

That is, in this embodiment, the electromagnets 112a to 112f and the iron plates 94, 96, and 98 opposed thereto constitute a first restraint force generating mechanism 132A (see FIG. 7) which generates restraint force for restraining a change in attitude of the stage body ST1 resulting from reaction force produced due to the minute driving of the substrate table TB1.

As shown in FIGS. 2 and 5, a pair of X movable mirrors 142a and 142b extends in the Y-axis direction along two sides on the upper surface of the substrate table TB1, and a Y movable mirror 142c extends in the X-axis direction along a third side (+Y-side). A wafer W1 is also fixed on the upper surface of the substrate table TB1 via a wafer holder (not shown) by electrostatic attraction or vacuum attraction. A fiducial mark plate FM1 is also fixed thereon so that the surface thereof is substantially flush with the surface of the wafer W1, as shown in FIG. 2. The fiducial mark plate FM1 has various fiducial marks, and is used, for example, to detect the reference position of the WST1.

The other wafer stage WST2 has a structure similar to that of the above wafer stage WST1 except that it is a mirror image. That is, the wafer stage WST2 includes, as shown in FIG. 4, a stage body ST2 serving as a second stage having a structure similar to that of the stage body ST1, and a substrate table TB2 serving as a second table supportingly floated above a protruding portion of the stage body ST2. Between the substrate table TB2 and the stage body ST2, a second minutely driving device 116B (see FIG. 7) having a structure similar to that of the above-described first minutely driving device 116A is placed so as to minutely drive the substrate table TB2 relative to the stage body ST2 in six degree-of-freedom directions, X, Y, Z, $\theta_X$, $\theta_Y$, and $\theta_Z$.

As shown in FIG. 4, the wafer stage WST2 is driven in the X-axis direction along the second guide bar 48 by an X axis linear motor 110B serving as a second driving device constituted by an armature unit 90B serving as a second stationary member similar to the above armature unit 90A, and a second moving member 100 similar to the above first moving member (100A and 100B).

A second restraint force generating mechanism 132B (see FIG. 7) is placed between the stage body ST2 and the second guide bar 48. The second restraint force generating mechanism 132B has a structure similar to that of the above-described first restraint force generating mechanism 132A and generates restraint force for restraining a change in attitude of the stage body ST2 resulting from reaction force produced when the substrate table TB2 is driven for Z-leveling by the second minutely driving device 116B.

As mentioned above, a restraint force generating mechanism can also be applied to the reticle stage RST to generate a restraint force to restrain a change in attitude of the reticle stage RST resulting from a reaction force produced due to the movement of the reticle stage RST.

A pair of X movable mirrors 142*d* and 142*e*, a Y movable mirror 142*f*, and a fiducial mark plate FM2 are fixed on the upper surface of the wafer stage WST2, more accurately, of the substrate table TB2, as shown in FIG. 2.

While both the wafer stages WST1 and WST2 have a two-part structure composed of the stage body and the substrate table, it is assumed, in the following description, that the wafer stages WST1 and WST2 act as a one-part structure, unless otherwise specified.

The outer surfaces of the movable mirrors 142*a* to 142*f* disposed on the wafer stages WST1 and WST2 (accurately, on the substrate tables TB1 and TB2 thereof) are mirror-finished to be reflecting surfaces. As shown in FIG. 2, interferometers shown by length measuring axes (BI1X, BI1Y, BI2X, and BI2Y) constituting an interferometer system, which will be described later, project interferometric beams onto the reflecting surfaces, and receives reflected beams so as to measure the amounts of displacement of the reflecting surfaces from the reference positions (in general, fixed mirrors placed on the side faces of the projection optical system or the alignment optical system) and to thereby measure the two-dimensional positions of the wafer stages WST1 and WST2. The structure of the interferometers having the length measuring axes of the interferometer system will be described later in detail.

Referring again to FIG. 1, the wafer space 40 is filled with clean helium gas (He) or dry nitrogen gas ($N_2$) having an air (oxygen) content of approximately several parts per million. A wafer loader chamber 50 for defining a wafer loader space 51 is placed adjacent to the +X-side half (right half in FIG. 1) in the X-axis direction (rightward and leftward direction) on the −Y-side (in front of the plane of FIG. 1) of the wafer chamber 42 defining the wafer space 40, as shown in FIG. 3.

A-wafer loader 53 formed of an articulated robot is placed inside the wafer loader space 51. An opening 51*a* is formed at a predetermined height in the +Y-side side wall of the wafer loader space 51. The opening 51*a* is opened and closed by a slide door 55 that is movable in the vertical direction (Z-axis direction).

A connecting portion 57 is formed on the outer side (+Y-side) of the opening 51*a* of the wafer loader chamber 50. The wafer loader chamber 50 communicates with a wafer port 42*a* formed in the −Y-side wall of the wafer chamber 42 via the connecting portion 57.

An opening 51*b* is formed at a predetermined height in the −Y-side wall of the wafer loader chamber 50 and is opened and closed by a door 59. Wafers are carried from and into an external feeding system through the opening 51*b*.

Although not shown, a wafer carrier for storing a plurality of wafers is placed inside the wafer loader space 51. The wafers are exchanged between the wafer carrier and a wafer stage placed in a predetermined loading position by the wafer loader 53.

While the wafer loader space 51 is also filled with helium gas or dry nitrogen gas, the purity of the gas is set to be slightly lower than that in the wafer space 40.

Returning to FIG. 1, an off-axis type alignment microscope ALG is installed at a position offset by a predetermined distance from the center of the optical axis of the projection optical system PL (that coincides with the center of projection of a reticle pattern image) toward the +X-side. In this embodiment, the alignment microscope ALG is a FIA (Field Image Alignment) type sensor that measures the positions in the X and Y two-dimensional directions of fiducial marks on the fiducial mark plates and alignment marks on the wafers. Information from the alignment microscope ALG is A/D-converted by an alignment, control device 156 (see FIG. 7), and digitized waveform signals are subjected to computation, thereby detecting the mark positions. The main control device 16 receives the result of detection and directs the stage control device 38 to make synchronous position correction and like during exposure, based on the result.

A LSA (Laser Step Alignment) type or LIA (Laser Interferometric Alignment) type sensor may be used as the alignment microscope ALG.

Although not shown in FIG. 1, a pair of reticle alignment microscopes 158A and 158B (see FIG. 7) of a TTR (Through The Reticle) type are placed above the reticle R in the exposure apparatus 10 of this embodiment. The reticle alignment microscopes 158A and 158B use exposure light that allows a reticle mark (not shown) on the reticle R and the marks on the fiducial mark plates FM1 and FM2 to be simultaneously observed via the projection optical system PL, as disclosed in, for example, Japanese Unexamined Patent Application Publication No. 7-176468 and U.S. Pat. No. 5,844,247 corresponding thereto. Detection signals from the reticle alignment microscopes 158A and 158B are supplied to the main control system 16 via the alignment control device 136. The disclosure of U.S. Pat. No. 5,844,247 is incorporated herein by reference in its entirety.

Although not shown in FIG. 1, each of the projection optical system PL and the alignment microscope ALG is provided with an auto-focusing/auto-leveling system (hereinafter appropriately refereed to an "AF/AL system") for detecting the in-focus position.

The configuration of such an exposure apparatus, in which each of the projection optical system PL and the alignment microscope ALG has an auto-focusing/auto-leveling system, is disclosed in detail in, for example, Japanese Unexamined Patent Application Publication No. 10-214783 and U.S. patent application Ser. No. 08/980,315 filed on Nov. 28, 1997 corresponding thereto. The disclosure of U.S. patent application Ser. No. 08/980,315 is incorporated herein by reference in its entirety.

Accordingly, in this embodiment, the positions of the alignment marks are measured by the alignment microscope ALG while carrying out auto-focusing/auto-leveling based on measurement and control by the AF/AL system as during exposure, in a manner similar to that of the exposure apparatus disclosed in the above patent documents. This allows high-precision alignment measurement. In other words, any offset (error) is not caused due to a difference in attitude of the stage between the exposure operation and the alignment operation.

The configuration, operation, and the like of an interferometer system 140 (see FIG. 7) for managing the positions of the wafer stages WST1 and WST2 will be briefly described with reference to FIGS. 1, 2, and 7.

Referring to FIG. 7, the interferometer system 140 includes two X-axis interferometers 32 and 34 and two Y-axis interferometers 33 and 35. In reality, the interferometers 32 to 35 are supported in a suspended manner by a supporting member (not shown) for supporting the alignment microscope ALG and the like placed in the wafer chamber 42.

FIG. 2 shows a state in which exposure of the wafer W2 on the wafer stage WST2 and alignment of the wafer W1 on the wafer stage WST1 are effected concurrently. In this state, an interferometric beam in the X-axis direction shown by a length measuring axis BI1X passing through the center of projection of the projection optical system PL (i.e., the optical axis AX) is being applied from the X-axis interferometer 32 onto the X movable mirror 142e on the wafer stage WST2. Similarly, an interferometric beam shown by a length measuring axis BI2X passing through the center of detection of the alignment microscope ALG (i.e., the optical axis SX) is being applied from the X-axis interferometer 34 onto the X movable mirror 142b on the wafer stage WST1. The interferometers 32 and 34 receive reflected light therefrom so as to measure the amounts of relative displacement of the movable mirrors from the reference positions and to thereby detect the X-axis positions of the wafer stages WST2 and WST1. In reality, the interferometers 32 and 34 are tri-axial interferometers having three optical axes, as shown in FIG. 2, and are capable of measurement of the amount of tilting and yawing ($\theta_Z$ rotation) as well as measurement of the X-axis positions of the wafer stages WST2 and WST1. Output values from the optical axes can be independently measured.

In the state shown in FIG. 2, an interferometric beam shown by a length measuring axis BI1Y passing through the center of projection of the projection optical system PL (i.e., the optical axis AX) is applied from the Y-axis interferometer 33 onto the Y movable mirror 142f on the wafer stage WST2. Similarly, an interferometric beam shown by a length measuring axis BI2Y passing through the center of detection of the alignment microscope ALG (i.e., the optical axis SX) is applied from the Y-axis interferometer 35 onto the Y movable mirror 142c on the wafer stage WST1. The interferometers 33 and 35 receive reflected light therefrom so as to measure the amounts of relative displacement of the movable mirrors from the reference positions and to thereby detect the Y-axis positions of the wafer stages WST2 and WST1. The interferometers 33 and 35 having the above length measuring axes BI1Y and BI2Y are bi-axial interferometers having two optical axes and are capable of measurement of the amount of tilting as well as measurement of the Y-axis positions of the wafer stages WST2 and WST1. Output values from the optical axes can be independently measured.

In the exposure apparatus 10 of this embodiment, as will be described later, the wafer stage WST1 and the wafer stage WST2 are interchanged with each other. After the interchange, the position of the wafer stage WST1 for exposure is measured by the interferometers 32 and 33 having the length measuring axes BI1X and BI1Y and the position of the wafer stage WST2 for alignment is measured by the interferometers 34 and 35 having the length measuring axes BI2X and BI2Y.

Accordingly, the positions of the wafer stages WST1 and WST2 can be precisely measured during both exposure and alignment without making so-called Abbe errors.

The values measured by the interferometers 32 to 35 constituting the interferometer system 140 are supplied to the main control device 16 via the stage control device 38.

The stage control device 38 manages the movements of the wafer stages WST1 and WST2 according to directions from the main control device 16.

FIG. 7 shows the principal configuration of a control system of the exposure apparatus 10 according to this embodiment. The control system principally comprises the main control device 16 for generally controlling the entire apparatus, the stage control device 38 placed under the control of the main control device 16, an alignment control device 156, and the like.

A step-and-scan exposure operation of the exposure apparatus 10 of this embodiment will now be described with particular emphasis on operations of the above components of the control system.

First, the stage control device 38 moves the wafer stage WST1 (or WST2) to the scanning start position for exposure of a first shot area of a wafer W1 (or W2) by controlling the X-axis linear motor 110A and the Y-axis linear motors 70A and 70B constituting the driving system for the wafer stage WST1 (or the X-axis linear motor 110B and the Y-axis linear motors 70C and 70D constituting the driving system for the wafer stage WST2) according to directions based the alignment result from the main control device 16 while monitoring the values measured by the interferometer 33 having the length measuring axis BI1Y and the interferometer 32 having the length measuring axis BI1X in the interferometer system 140.

The stage control device 38 then starts relative scanning in the Y-axis direction of the reticle R and the wafer W1 (or W2), that is, of the reticle stage RST and the wafer stage WST1 (or WST2) according to directions from the main control device 16. When the stages RST and WST1 (or WST2) reach their respective target scanning velocities and a constant-velocity synchronous state is brought about, illumination of the pattern area of the reticle R with pulsed ultraviolet light from the illumination unit ILU is started, that is, a scan-exposure operation is started. The above relative scanning is effected by controlling the reticle driving section 26 and the linear motors 110A, 70A, and 70B constituting the driving system for the wafer stage WST1 (or the linear motors 110B, 70C, and 70D constituting the driving system for the wafer stage WST2) while monitoring the measurement values of the length measuring axes BI1Y and BI1X in the interferometer system 140 and the length measuring axes BI7Y and BI6X in the reticle interferometer system 28.

In advance of the beginning of the scan-exposure operation, when the stages reach their respective target scanning velocities, the main control device 16 directs the laser control device 18 to start emission of pulsed light.

Since the movement of a predetermined blade of a movable reticle blind in the illumination unit ILU is controlled in synchronism with the movement of the reticle stage RST by the stage control device 38 via a blind driving device (not shown), the areas of the reticle R outside the pattern area are shielded from pulsed ultraviolet light, in a manner similar to that of a general type of scanning stepper.

In particular, during the above scan-exposure operation, the stage control device 38 synchronizes the reticle stage RST and the wafer stage WST1 (or WST2) via the reticle driving section 26 and the linear motors of the driving system for the wafer stage so that the ratio of the moving velocity Vw in the Y-axis direction of the wafer stage WST1

(or WST2) and the moving velocity Vr in the Y-axis direction of the reticle stage RST is maintained in accordance with the projection.

When different sections of the pattern area on the reticle R are sequentially illuminated with pulsed ultraviolet light and illumination of the entire pattern area is completed, the scan-exposure operation for the first shot area on the wafer W1 (or W2) is finished. In this way, the pattern on the reticle R is reduced and transferred onto the first shot area via the projection optical system PL.

The blind driving device (not shown) synchronizes the movement of a predetermined blade of the movable reticle blind and the movement of the reticle stage RST according to directions from the stage control device 38 so as to prevent pulsed ultraviolet light from being applied outside the pattern area of the reticle R immediately after the scan-exposure operation is completed.

When the scan-exposure operation for the first shot area is thus completed, the stage control device 38 causes the wafer stage WST1 (or WST2) to step in the X-axis direction via the linear motors 110A, 70A, and 70B constituting the driving system for the wafer stage WST1 (or the linear motors 110B, 70C, and 70D constituting the driving system for the wafer stage WST2) according to directions from the main control device 16, and places the wafer stage into a scan-exposure start position for the second shot area. During the stepping motion, the stage control device 38 measures the amount of shift of the wafer stage WST1 (or WST2) in the X, Y, and $\theta_Z$ directions in real time based on the values measured by the interferometers 33 and 32 having the length measuring axes BI1Y and BI1X. Based on the result of measurement, the stage control device 38 controls the position of the wafer stage WST1 (or WST2) so that the XY position of the wafer stage WST1 (or WST2) shifts in a predetermined manner. The stage control device 38 also controls the reticle driving section 26 based on information about the shift in the $\theta_Z$ direction of the wafer stage WST1 (or WST2), and thereby controls the rotation of the reticle stage RST (reticle fine-adjustment stage) so as to compensate for errors in rotation of the wafer stage.

Then, the operations of the sections are controlled by the stage control device 38 and the laser control device 18 according to directions from the main control device 16, and a scan-exposure operation for the second shot area on the wafer W1 (or W2) is performed in a manner similar to the above.

In this way, a scan-exposure operation for a shot on the wafer W1 (or W2) and a stepping operation for exposure of the next shot area are performed repeatedly, and the pattern of the reticle R is sequentially transferred onto all the shot areas on the wafer to be exposed.

For example, in order to correct the movement starting positions (synchronous positions) of the reticle stage and the wafer stage in the scan-exposure operation, the main control device 16 directs the stage control device 38, which controls the movements of the stages, to correct the positions of the stages in accordance with the amount of correction.

By way of example, description will be given of one of the wafer stages WST1. When the wafer stage WST1 is driven in the +X-direction (or the –X direction) together with the moving members 100A and 100B of the X-axis linear motor 110A during the above-described stepping motion, reaction force in the –X-direction (or +X-direction) acts on the first guide bar 46 having the armature unit 90A serving as the stationary member of the X-axis linear motor 110A. However, the stage control device 38 appropriately controls magnetic forces generated by the electromagnets 58 of the X-axis direction supporting mechanism 68A, thereby canceling the reaction force. In this case, the stage control device 38 controls the magnetic forces generated by the electromagnets 58 in accordance with a thrust command value. This makes it possible to vary the rigidity of the X-axis direction supporting mechanism 68A in accordance with the driving force of the X-axis linear motor 110A for driving the wafer stage WST1 in the X-axis direction, and reaction force thereto, and to cancel the reaction force due to the driving in the X-axis direction of the wafer stage WST1.

All the fixed guides 74A and 74B, the movable guides 72A and 72B, the magnetic pole units 60A and 60B, the first guide bar 46, the second guide bar 48, and the like may be displaced in the opposite X-axis direction as the motion of the wafer stage WST1 by repeating the operation of stepping the wafer stage WST1 and the operation of canceling reaction force during the stepping operation described above. When such displacement occurs, the stage control device 38 controls the adjustment motors 80C and 80D so that the devices can be returned to their desired positions.

In contrast, during the above scan-exposure operation or the like the wafer stage WST1 is driven in the +Y-direction (or –Y-direction) together with the first guide bar 46 by the Y-axis linear motors 70A and 70B, and reaction forces to driving forces acting on the moving members 54A and 54B of the Y-axis linear motors 70A and 70B act on the magnetic pole units 60A and 60B serving as the stationary members thereof. This moves the magnetic pole units 60A and 60B in the –Y-axis direction together with the movable guides 72A and 72B. In this case, when it is assumed that frictional forces are small enough to be negligible between the armature unit 54A and the magnetic pole unit 60A, between the armature unit 54B and the magnetic pole unit 60B, between the non-contact supporting mechanisms 52A and 52B and the Z-axis guides 44A and 44B, between the movable guide 72A and the fixed guide 74A, and between the movable guide 72B and the fixed guide 74B, the momentum of the system including the armature units 54A and 54B, the magnetic pole units 60A and 60B, the non-contact supporting mechanisms 52A and 52B, the movable guides 72A and 72B, the fixed guides 74A and 74B, and the like is conserved. In this case, since the center of gravity of the system is not displaced, unbalanced load is not produced. Therefore, the movement of the wafer stage WST1 in the scanning direction will not vibrate the other components.

By repeating the above scan-exposure operation, the magnetic pole units 60A and 60B may be displaced in the Y-axis direction together with the movable guides 72A and 72B. When such displacement occurs, the stage control device 38 controls the adjustment motors 80A and 80B so that the movable guides 72A and 72B and the magnetic pole units 60A and 60B can be returned to their desired positions.

The above also applies to a scan-exposure operation and a stepping operation of the other wafer stage WST2.

A concurrent operation using two wafer stages will now be described.

In the exposure apparatus 10 of this embodiment, while a wafer on one of the wafer stages (WST1 or WST2) is exposed, a wafer is replaced and aligned on the other wafer stage (WST2 or WST1).

More specifically, referring to FIG. 3, while a wafer W2 on the wafer stage WST2 is being exposed via the projection optical system PL in the above-described manner, the wafer stage WST1 is placed in a predetermined loading position and a wafer thereon is replaced by the wafer loader 53 and a delivery mechanism (not shown) that is also disposed thereon.

In this embodiment, it is assumed that the loading position is set at a position (alignment reference position) where the fiducial mark plate FM1 (or FM2) is placed directly below the alignment microscope ALG.

During the replacement operation, the position in the XY plane of the wafer stage WST1 (including $\theta_Z$ rotation and the like) is managed by the stage control device 38 based on the values measured by the interferometers 34 and 35 having the length measuring axes BI2X and BI2Y in the interferometer system 140. The position of the wafer stage WST2, where exposure is effected, is managed by the stage control device 38 based on the values measured by the interferometers 32 and 33 having the length measuring axes BI1X and BI1Y in the interferometer system 140.

In a state in which the wafer stage WST1 is placed at the loading position (i.e., alignment reference position), a first fiducial mark on the fiducial mark plate FM1 is detected under the control of the main control device 16. When detecting the first fiducial mark, an image of the first fiducial mark is picked up by the alignment microscope ALG, and signals representing the image are sent to the alignment control device 156. The alignment control device 156 subjects the image signals to a predetermined process and parses the processed signals, thereby detecting the position of the first fiducial mark relative to the center of an index of the alignment microscope ALG. The main control device 16 calculates the coordinate position of the first fiducial mark on the fiducial mark plate FM1 in a coordinate system (hereinafter appropriately referred to an "alignment stage coordinate system") using the length measuring axes BI2X and BI2Y based on the position of the first fiducial mark and the results of calculations by the interferometers 34 and 35 having the length measuring axes BI2X and BI2Y. During this process, exposure is continued on the wafer stage WST2.

Subsequently, fine alignment is effected on the wafer stage WST1 so as to detect the layout of the shot areas on the wafer W1 by EGA. More specifically, the wafer stage WST1 is sequentially moved based on data on the designed shot layout (data on the alignment mark position) while managing the position of the wafer stage ST1 based on the values measured by the interferometers 34 and 35 having the length measuring axes BI2X and BI2Y, the positions of the alignment marks in predetermined sample shot areas on the wafer W1 are measured by the alignment microscope ALG, and layout data on all the shot areas are calculated based on the measurement results and the designed coordinate data on the shot layout by statistical calculations using the least squares method disclosed in, for example, Japanese Unexamined Patent Application Publication No. 61-44429 and U.S. Pat. No. 4,780,617 corresponding thereto. The coordinate position of each shot area in the stage coordinates is thereby calculated during the alignment operation. During the EGA operation, the main control device 16 controls operations of the components and makes the above-described calculation. The disclosure of U.S. Pat. No. 4,780,617 is incorporated herein by reference in its entirety.

The main control device 16 subtracts the coordinate position of the first fiducial mark from the coordinate position of each shot area and thereby finds the relative positional relationship between the shot area and the first fiducial mark.

While the alignment operation is being performed on the wafer stage WST1, the above-described exposure operation is continued on the wafer stage WST2.

In the exposure operation (exposure sequence) and the alignment operation (alignment sequence) concurrently performed on the two wafer stages WST1 and WST2, the wafer stage, where the operation has been completed earlier, is put on standby. When both operations are completed, the wafer stages WST1 and WST2 exchange positions.

By way of example, it is assumed that, when both operations are completed, the stage control device 36 placed under the control of the main control device 16 controls the position of the wafer stage WST2 based on the values measured by the interferometers 32 and 33 having the length measuring axes BI1X and BI1Y and controls the position of the wafer stage WST1 based on the values measured by the interferometers 34 and 35 having the length measuring axes BI2X and BI2Y.

In this case, since the interferometric beam from the interferometer 35 does not impinge on the wafer stage WST1 during the interchange operation of the stages, the following measures are taken in this embodiment. After the alignment operation, the stage control device 38 returns the wafer stage WST1 to the loading position according to directions from the main control device 16. Concurrently, the stage control device 38 drives the Y-axis linear motors 70C and 70D according to directions from the main control device 16 so as to move the wafer stage WST2 in the +Y-axis direction by a predetermined distance. This causes the interferometric beam from the interferometer 32 not to be applied to the movable mirror 142e of the wafer stage WST2, but to be applied to the movable mirror 142a of the wafer stage WST1.

Accordingly, the stage control device 38 resets the interferometer 32 according to directions from the main control device 16 at the time when the wafer stage WST2 is placed in the loading position. After that, the X-axis position of the wafer stage WST1 is managed based on the value measured by the interferometer 32 having the length measuring axis BI1X.

Subsequently, the stage control device 38 appropriately drives the X-axis linear motor 110A and the Y-axis linear motors 70A and 70B so as to move the wafer stage WST1 in the −X-axis direction toward the exposure reference position, that is, the position where the fiducial mark plate FM1 is placed directly below the projection optical system PL. During this movement, the interferometric beam from the interferometer 35 is lost from the movable mirror 142c of the wafer stage WST1. After that, the control device 38 servo-controls the position in the Y-axis position of the wafer stage WST1 relative to the previous Y-axis position as a target position. The stage control device 38 also controls the X-axis position of the wafer stage WST1 based on the measured value of the interferometer 32.

Concurrently with the movement of the wafer stage WST1 in the −X-axis direction, the stage control device 38 moves the wafer stage WST2 in the +X-axis direction.

During the movements of the wafer stages WST1 and WST2, before the wafer stage WST1 reaches the exposure reference position, the interferometric beam from the interferometer 33 shown by the length measuring axis BI1Y is lost from the movable mirror 142f of the wafer stage WST2, and simultaneously, is applied onto the movable mirror 142c of the wafer stage WST1.

When the wafer stage WST1 reaches the exposure reference position, the main control device 16 directs the reticle alignment microscopes 158A and 158E to detect the relative positions of a pair of second fiducial marks on the fiducial mark plate FM1 and images of marks on the reticle corresponding thereto projected onto the wafer by using exposure light, that is, to fetch image signals corresponding to the mark images. Since the interferometer 33 has been reset by the stage control device 38 according to directions from the main control device 16 in advance to this operation, the position of the wafer stage WST1 is subsequently managed by the coordinates using the length measuring axes BI1X and BI1Y of the interferometers 32 and 33 (hereinafter referred to as an "exposure stage coordinate system").

As a result of fetching of the image signals of the mark images by using the reticle alignment microscopes 158A and 158B, the coordinate positions of the second fiducial marks on the fiducial mark plate FM1 and the coordinate positions of the images of the marks on the reticle R projected onto the wafer in the exposure stage coordinate system are detected, and the relative positional relationship between the exposure position (the center of projection of the projection optical system PL) and the coordinate positions of the second fiducial marks on the fiducial mark plate FM1 is found based on the difference between the coordinate positions.

The main control device 16 finally calculates the relative positional relationship between the exposure position and each shot area based on the relative positional relationship between the first fiducial mark on the fiducial mark plate FM1 and the shot area and the relative positional relationship between the exposure position and the coordinate positions of the second fiducial marks on the fiducial mark plate FM1. According to the result of calculation, the wafer stage WST1 is sequentially placed into scan-exposure starting positions of the shot areas on the wafer W1, and the reticle stage SST and the wafer stage WST1 are relatively and synchronously scanned in the scanning direction for exposure of each shot area, in a manner similar to that of the wafer W2, thereby effecting scan-exposure.

Of course, wafer replacement and alignment are performed on the wafer stage WST2 concurrently with exposure on the wafer W1.

After that, the exposure sequence for the wafer on one of the wafer stages and the wafer replacement and alignment sequence for the other wafer are concurrently repeated while independently moving the wafer stages WST1 and WST2 in the two-dimensional directions, in a manner similar to the above.

In the exposure apparatus 10 of this embodiment, the exposure sequence for the wafer on one of the wafer stages and the wafer replacement and alignment sequence for the other wafer are thus performed concurrently. In order to achieve high-precision exposure, it is necessary to execute wafer focusing and leveling control, that is, Z-leveling control, on the substrate table based on the result of measurement by the above-described AF/AL system, during both the alignment and exposure operations.

For example, in a case in which the substrate table TB1 is driven in the Z-axis direction by the first minutely driving device 116A for alignment on the wafer stage WST1, all the electromagnets 112a to 112f of the first restraint force generating mechanism 132A are deactivated. Since reaction force produced due to the Z-axis driving of the substrate table TB1 is canceled by the turning of the stage body ST1 on the center of gravity G, as described above, it will not vibrate the substrate table TB2 on the wafer stage WST2 which is being subjected to exposure.

On the side of the wafer stage WST2 which is being subjected to exposure, focusing and leveling control must be precisely effected. For that purpose, when executing the Z-axis leveling control on the substrate table TB2 by the second minutely driving device 116B according to directions from the main control device 16, the stage control device 38 simultaneously subjects the second restraint force generating mechanism 132B to feed-forward control so as to cancel the turning of the stage body ST2 due to reaction force to the driving force for the substrate table TB2. That is, the Z-axis leveling control is precisely executed on the substrate table TB2 by preventing the stage body ST2 from changing its attitude. In this case, reaction force produced due to driving of the substrate table TB2 may be transmitted to the substrate table TB1 of the wafer stage WST1. However, the main control device 16 performs control so that the measurement of the alignment mark is timed to coincide with the stop of the wafer stage WST2, thereby preventing alignment accuracy from being deteriorated.

As described above in detail, in the stage device 12 of this embodiment, the stage body ST1 is driven in the X-axis direction along the first guide bar 46 by the X-axis linear motor 110A while being cantilevered by the first guide bar 46. The stage body ST2 is driven in the X-axis direction along the second guide bar 48 by the X-axis linear motor 110B while being cantilevered by the second guide bar 48. The first guide bar 46 and the second guide bar 48 are independently driven in the Y-axis direction by the Y-axis linear motors 70A and 70B and the Y-axis linear motors 70C and 70D. That is, the stage body ST1 and the stage body ST2 are independently movable in the XY two-dimensional plane.

In a state in which the first guide bar 46 and the second guide bar 48 are closest to each other, the end of the stage body ST1 opposite from the side supported by the first guide bar 46 is placed above the second guide bar 48, and the end of the stage body ST2 opposite from the side supported by the second guide bar 48 is placed above the first guide bar 46. This does not cause any serious problem. That is, since this embodiment can employ a structure in which the moving range of the stage body ST1 and the moving range of the stage body ST2 overlap, the two stages can be moved independently, freely, and two-dimensionally in a footprint equivalent to that of a single-stage stage device, and the size of the stage device can be reduced.

In the stage device 12 of this embodiment, the point of action of driving forces in the X-axis direction of the stage bodies ST1 and ST2 are set at the centers of gravity thereof. This can prevent unnecessary rotation moment from acting on the stage bodies ST1 and ST2 when the stage bodies are driven in the X-axis direction.

The stage device 12 comprises the substrate table TB1 supported above the stage body ST1 in a non-contact manner so as to hold the wafer 1, the first minutely driving mechanism 116A for minutely driving the substrate table TB1 with six degrees of freedom, the substrate table TB2 supported above the stage body ST2 in a non-contact manner so as to hold the wafer 2, and the second minutely driving device 116B for minutely driving the substrate table TB2 with six degrees of freedom. For this reason, for example, when the substrate table TB1 is minutely driven for Z-leveling by the first minutely driving device 116A, the stage body ST1 is turned by a predetermined amount on a predetermined rotation axis passing through the center of gravity G thereof by reaction force produced due to the minute driving, thereby absorbing the reaction force. In the case of Z-leveling driving of the substrate table TB2 by the second minutely driving device 116B, reaction force produced due to the driving of the substrate table TB2 is similarly absorbed by the turning of the stage body ST1.

The stage device 12 further comprises the first restraint force generating mechanism 132A for generating restraint force for restraining a change in attitude of the stage body ST1 resulting from reaction force produced due to the minute driving of the substrate table TB1, and the second restraint force generating mechanism 132B for generating restraint force for restraining a change in attitude of the stage body ST2 resulting from reaction force produced due to the minute driving of the substrate table TB2. This makes it possible to restrain or prevent changes in attitude of the stage bodies ST1 and ST2, as necessary.

The stage control device 38 subjects the first restraint force generating mechanism 132A to feed-forward control in synchronization with the driving of the substrate table TB1 by the first minutely driving device 116A, and also subjects the second restraint force generating mechanism 132B to feed-forward control in synchronization with the driving of the substrate table TB2 by the second minutely driving device 116B. Changes in attitude of the stage bodies ST1 and ST2 can be thereby prevented, that is, the substrate tables TB1 and TB2 can be minutely driven while maintaining the original positions of the stage bodies ST1 and ST2.

In the exposure apparatus 10 of this embodiment, wafer replacement and alignment are effected on a wafer on one of the substrate tables concurrently with exposure of a wafer on the other substrate table. For example, during an alignment operation for a wafer on one of the substrate tables, even when the substrate table is driven, for example, is driven for focusing and leveling, reaction force produced to the driving will not vibrate the other substrate table which is being subjected to exposure. Therefore, it is possible to improve throughput by concurrent processing of wafers on the two substrate tables and to improve exposure accuracy.

The exposure apparatus 10 comprises the single alignment microscope ALG for detecting the alignment marks (position detection marks) formed on the wafer on each of the stage bodies ST1 and ST2 when the stage body is moved into a predetermined area (area adjacent to and below the alignment microscope ALG), and the single projection optical system PL for projecting exposure illumination light onto the wafer on each of the wafer stages WST1 and WST2 when the stage body is moved into the predetermined area. That is, since the wafer stages WST1 and WST2 can be interchanged in the exposure apparatus 10, one alignment microscope and one wafer loader are sufficient. Therefore, it is possible to reduce the size (length in the X-axis direction) of the exposure apparatus including the wafer chamber 42 and to thereby reduce the footprint. Furthermore, since wafers on the wafer stages are replaced at one position, the opening (area of the opening) of the wafer chamber 42 is reduced, and the purity of helium gas in the wafer chamber 42 is prevented from being decreased.

Since the exposure apparatus 10 provides high throughput, as described above, even when the off-axis alignment microscope ALG is placed at a great distance from the projection optical system PL, the throughput will be hardly deteriorated. This makes it possible to design and install a cylindrical optical system with high N.A. (numerical aperture) which reduces aberrations.

Since exposure is effected with vacuum pulsed ultraviolet light used as illumination light for exposure, a fine pattern can be transferred onto the wafer at high resolution.

As can be appreciated from FIG. 1, since high-purity helium gas or dry nitrogen gas is filled in all the optical paths of exposure illumination light, a decrease in transmittance for exposure illumination light (pulsed ultraviolet light) is minimized, and the amount of exposure can be precisely controlled.

The configurations of the stage device and the exposure apparatus described in the above embodiment are given as an example, the present invention is not limited to the above embodiment. For example, in the stage device, only one of the first guide bars and the second guide bar may be driven in the second direction (Y-axis direction in this embodiment) by the third driving device. This allows the first guide bar and the second guide bar to be moved close to and apart from each other. Therefore, it is possible to independently and freely move two stages in a footprint that is slightly larger than that of the single stage type stage device.

While the three movable mirrors 142a, 142B, and 142c and the three movable mirrors 142d, 142e, and 142f, each having a reflecting surface on its outer side, are respectively placed on the substrate tables ST1 and ST2 in this embodiment, two movable mirrors may be placed on each substrate table. In this case, the layout of the length measuring axes of the interferometer system is changed. Instead of the movable mirrors, two or three side faces of the substrate tables may be mirror-finished to become reflecting surfaces for use as movable mirrors.

While the illumination unit ILU has the housing 20, the reticle stage RST is housed in the reticle chamber 22, the stage device 12 is installed inside the wafer chamber 42, and the housing 20, the reticle chamber 22, the wafer chamber 42, and the barrel of the projection optical system PL are filled with inert gas, such as helium gas, in this embodiment, all the components of the exposure apparatus may be housed in a single chamber.

While the stage device according to the present invention is applied to the scanning stepper in the above embodiment, it is also suitably applicable to a stationary exposure apparatus, such as a stepper which effects exposure with a mask and a substrate placed in a stationary state. In such a case, exposure accuracy and throughput can be improved in a manner similar to that in the above embodiment.

The stage device is also suitably applicable to a proximity exposure apparatus in which a pattern on a mask is transferred onto a substrate with the mask and the substrate placed in close proximity without using a projection optical system.

The present invention is, of course, also applicable not only to an exposure apparatus for use in fabrication of semiconductor devices, but also to an exposure apparatus which transfers a device pattern onto a glass plate so as to produce displays, such as liquid crystal displays and plasma displays, an exposure apparatus which transfers a device pattern onto a ceramic wafer so as to produce thin-film magnetic heads, and an exposure apparatus for use in producing image pickup devices, such as CCDs.

The present invention is also applicable not only to micro-devices such as semiconductor devices, but also to an exposure apparatus which transfers a circuit pattern onto a glass substrate, a silicon wafer, and the like in order to manufacture a reticle or a mask for use in an optical exposure apparatus, an EUV (Extreme Ultraviolet) exposure apparatus, an X-ray exposure apparatus, an electron beam exposure apparatus, and the like. In an exposure apparatus using DUV (Deep Ultraviolet) light, VUV (Vacuum Ultraviolet) light, and the like, a light transmissive reticle is generally used, and a reticle substrate is made of quartz glass, quartz glass doped with fluorine, fluorite, magnesium fluoride, or quartz crystal. In the proximity X-ray exposure apparatus or electron beam exposure apparatus, a light transmissive mask (a stencil mask or a membrane mask) is used. In the EUV exposure apparatus, a reflective mask is used, and a silicon wafer or the like is used as a mask substrate.

The stage device of the present invention is also widely applicable not only to exposure apparatus, but also to other substrate processing apparatus (for example, a laser repairing apparatus or a substrate inspection apparatus) or sample positioning devices in other precision machines.

The exposure apparatus of the present invention may employ not only the projection optical system, but also a charged particle beam optical system, such as an X-ray optical system or an electron optical system. For example, and electron optical system may include an electron lens and a polarizer, and thermoelectron-emitting lanthanum hexaborite ($LaB_6$) or tantalum (Ta) is used as an electron gun. Of course, the optical path through which an electron beam passes is placed in a vacuum.

The exposure apparatus of the present invention may use, as illumination light for exposure, not only the above described deep ultraviolet light or vacuum ultraviolet light, but also soft X-ray EUV light with a wavelength of approximately 5 nm to 30 nm. For example, the vacuum ultraviolet light includes ArF excimer laser, light and $F_2$ laser light. Alternatively, a harmonic wave may be used which is obtained by amplifying single-waveform laser light in an infrared region or a visible region emitted from a DFB semiconductor laser or a fiber laser by, for example, a fiber amplifier doped with erbium (or both erbium and ytterbium) and wavelength-converting the laser light into ultraviolet light by using a nonlinear optical crystal.

While the projection optical system described in the above embodiment is of a reduction type, it may be of a 1× magnification (unity) type or of a magnification type. The reflecting and refracting projection optical system is not limited to that described above, and it may be, for example, a reduction system which has a circular image field, is telecentric on both the object side and the image plane side, and has a reduction ratio of 1/4 or 1/5, for example. In a scan-exposure apparatus having this type of reflecting and refracting projection optical system, the area of projection of illumination light may be within the visual field of the projection optical system, be centered on the optical axis thereof, and be shaped like a rectangular slit extending in a direction nearly orthogonal to the scanning direction of a reticle or a wafer. Such a scan-exposure apparatus with the reflecting and refracting projection optical system allows a fine pattern of approximately 100 nmL/s to be precisely transferred onto a wafer even when, for example, $F_2$ laser light with a wavelength of 157 nm is used as exposure illumination light.

Each of the following exemplary embodiments may comprise some, or substantially all, of the various features described in the first embodiment, including but not limited to, a restraint force generating mechanism applied to the reticle stage RST, and the first, second and third driving devices, such as, the band iron plates 66A, 66B, upper and lower magnet mounting members 56A, 56B, iron plates 94, 96, 98, the electromagnets 112c, 112e, non-contact bearings 208, electromagnets 58, etc.

Second Embodiment

Figure 8:
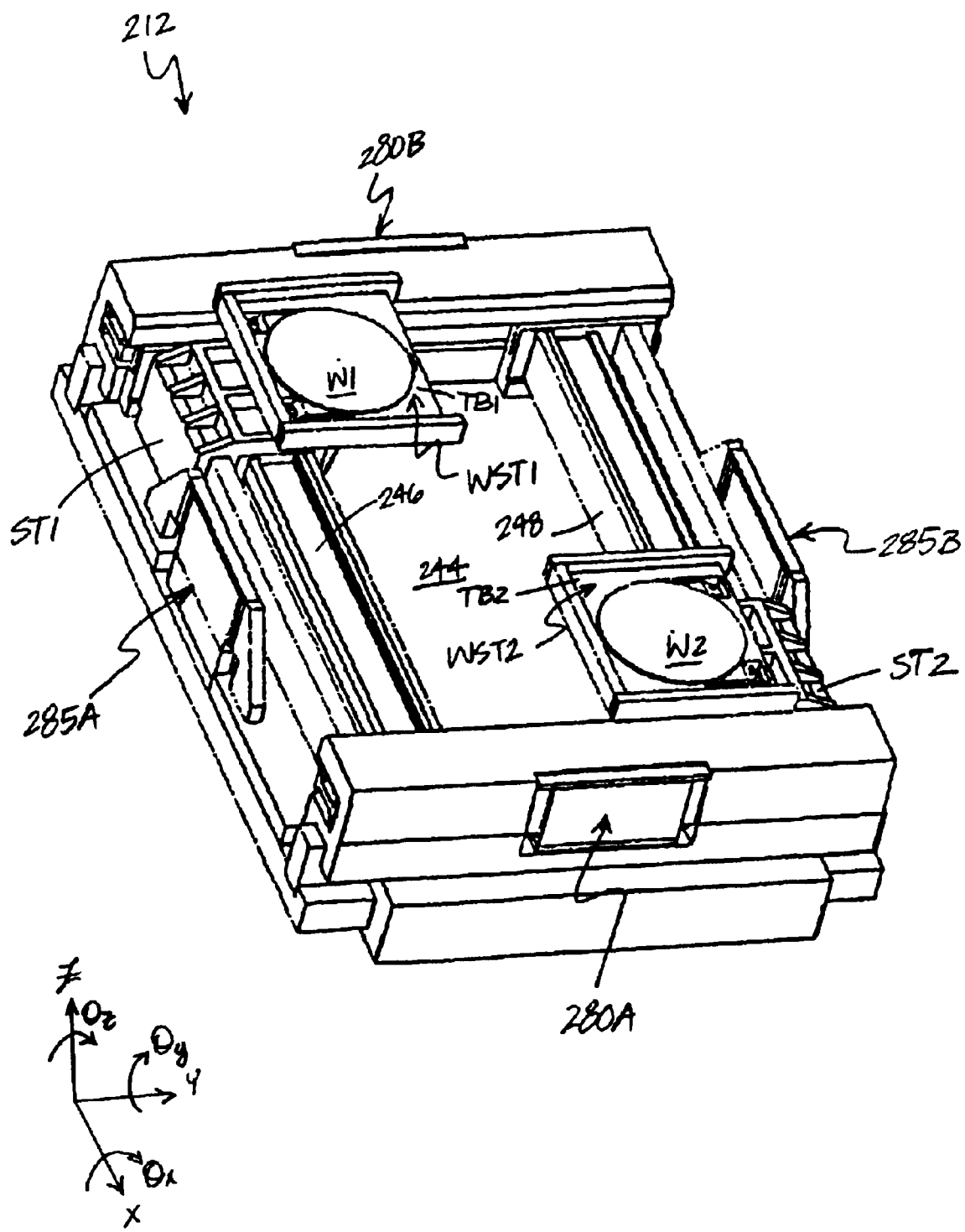
FIG. 8 is a perspective view showing a second embodiment of the stage device of the invention.

FIG. 8 is a perspective view illustrating a second embodiment of the stage device. The second embodiment has a construction similar to that of the first embodiment shown in FIG. 4, but differs as follows. In this embodiment, an overhang amount for the first wafer stage ST1 and the second wafer stage ST2 is substantially reduced as compared with the overhang amount illustrated in the first embodiment as shown in FIG. 6B. Further, a pair of X trim motors 285A, 285B and a pair of Y trim motors 280A, 280B are provided in this second embodiment. The X-axis direction is defined as the first direction and the Y-axis direction is defined as the second direction. The components of the stage device 212 of the second embodiment will be described below in detail mainly with reference to FIGS. 8 and 9, and as necessary with reference to other figures.

The stage device 212 comprises a base plate 244 horizontally supported on the inner bottom surface of the wafer chamber 42 (as shown in FIG. 1), an X countermass 245, including two X-axis frame members 282A, 282B extending in the X-axis direction and two Y-axis frame members 274A, 274B extending in the Y-axis direction connected at their ends to the X-axis frame members 282A, 282B. The X countermass 245 is supportingly floated above the upper surface of the base plate 244. When the stages WST1, WST2 are driven in the X-direction, reaction forces in the opposite direction are applied to the respective X-countermasses 245. Since the X-countermasses 245 are floatingly supported for X-direction movement, they will move in the opposite direction of movement of the stage(s) WST1 and/or WST2 to absorb the reaction force.

Each of the X-axis frame members 282A and 282B has, on its upper surface adjacent to the ends, a groove 284 extending in the Y-axis direction for fixedly receiving the Y-axis frame members 274A, 274B. Two Y countermasses 272A, 272B are supportingly floated above the two Y-axis frame members 274A, 274B, respectively. A first guide bar 246 and a second guide bar 248 are supportingly floated at their respective ends along a yoke 262 of the Y countermasses 272A, 272B and move in the Y-axis direction. Wafer stages WST1 and WST2 including wafer stage tables TB1 and TB2, which hold wafers W1 and W2, respectively, are movable in the X-axis direction along the first and second guide bars 246 and 248. Y trim motors 280A, 280B and X trim motors 285A, 285B are provided to maintain the countermasses within predetermined stroke ranges so that drifting of the countermasses over time can be compensated for. The countermasses can also be reset after each scan.

Figure 9:
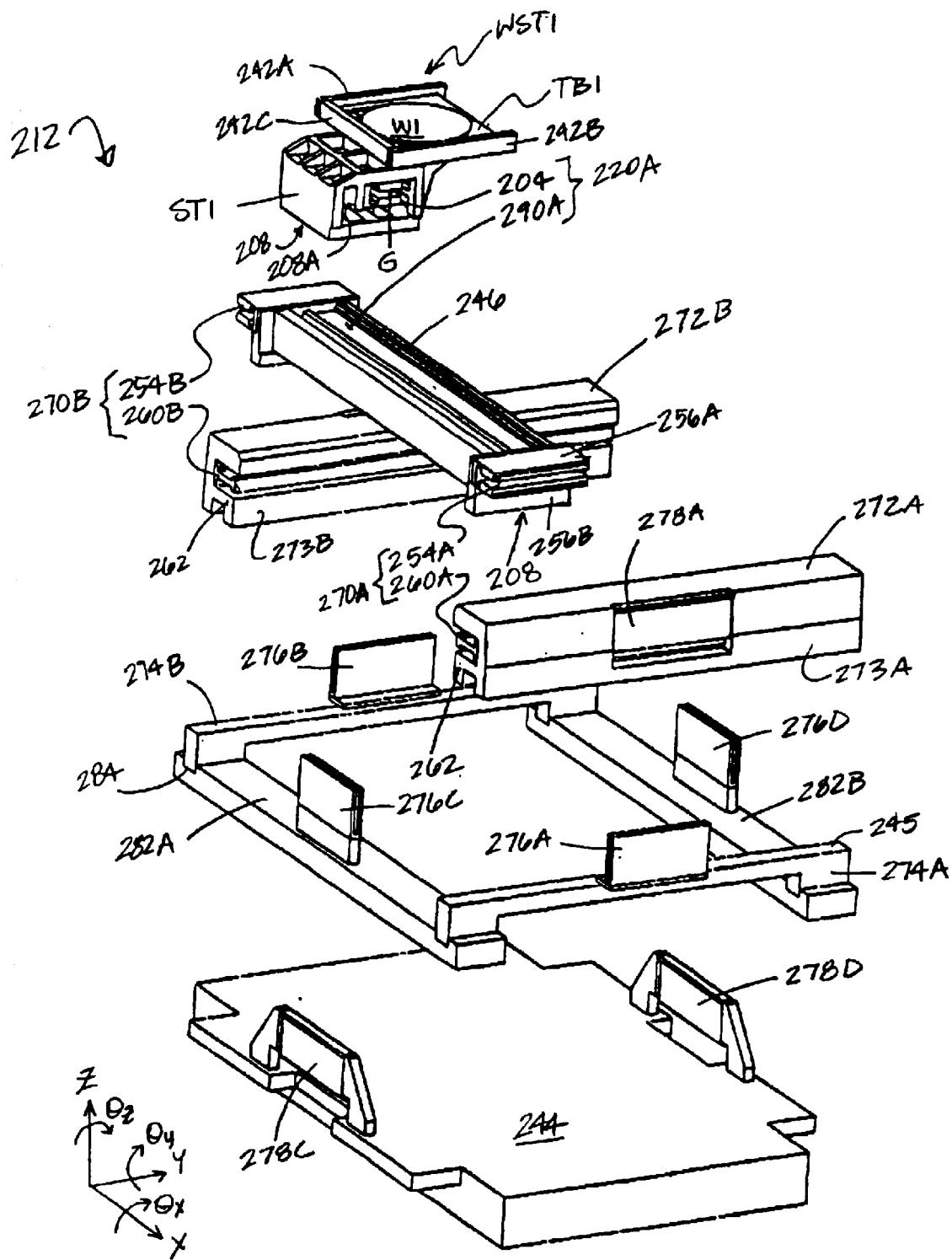
FIG. 9 is an enlarged, exploded view of a part of the stage device shown in FIG. 8.

Referring to FIG. 9, Y magnets 254A and 254B are provided in the shape of a flat plate of a predetermined thickness at the ends of the first guide bar 246. The Y magnet 254A and a coil 260A opposed thereto constitute a moving magnet type Y-axis linear motor. Y coils 260A and 260B extend in the Y-axis direction and sandwich the leading end of the Y magnets 254A and 254B, respectively, from above and below. The Y coils 260A and 260B include a yoke 262 having a U-shaped XZ cross section. The magnetic interaction between the Y coils 260A, 260B and the Y magnets 254A, 254B constitute Y-axis linear motors (or a third driving device). The Y-axis linear motors 270A, 270B are similar in construction and function to the Y-axis linear motors 70A and 70B described in the first embodiment and shown in FIG. 4. Y axis linear motors (not shown) are also provided at the ends of the second guide bar 248 and are also similar in construction and function to the Y-axis linear motors 270A, 270B disposed at the ends of the first guide bar 246.

Referring again to FIG. 9, Y countermasses 272A, 272B including movable guides 273A and 273B, having a U-shaped XZ cross-section and extending in the Y-axis direction are fixed integrally to the lower end of the Y countermasses 272A, 272B. Movable guides 273A and 273B are similar in design and function to the movable guides 72A and 72B of FIG. 1. Referring particularly to movable guide 273A, movable guide 273A is supported in a non-contact manner over a Y-axis frame member 274A shaped like an elongated rectangular frame, as viewed from above, via a non-contact hydrostatic gas bearing. That is, the movable guide 273A is movable in the Y-axis direction along the Y-axis frame member 274A of the X countermass 245, together with the Y coil 260A. When the first and/or second guide bars 246, 248 are driven in the Y-direction, a reaction force in the opposite direction is applied to the Y-countermasses 272A and 272B. Since the Y-countermasses are floatingly supported for Y-direction movement, they will move in the opposite direction of movement of the guide bar(s) 246 and/or 248 to absorb the reaction force.

Y trim coil 278A is located at about the center in the longitudinal direction of the back face of the Y countermass 272A. A Y trim magnet 276A is fixed to a portion of the Y-axis frame member 274A and is opposed to the Y trim coil 278A in a non-contact manner. The Y trim magnet 276A and the Y trim coil 278A constitute a Y trim adjustment motor 280A for adjusting the position of the Y countermass 272A along the Y-axis frame member 274A of the X countermass 245. The adjustment motor 280A places the Y countermass 272A (and the associated Y coil 260A) into a predetermined Y-axis position if Y countermass 272A has drifted from a predetermined Y-axis stroke range. The other Y countermass 272B is similar in construction and function to that of the first Y countermass 272A described above.

An X trim magnet 276C is located at about the center, in the X-axis longitudinal direction, on the top face of the X-axis frame member 282A. An X trim coil 278C protrudes from the upper face of the base 244 adjacent to the center of the X-axis frame member 282A in the X-axis longitudinal direction adjacent to and in mating fashion with the X trim magnet 276C. The X trim magnet 276C is opposed to the X trim coil 278C in a non-contact manner. The X trim magnet 276C and the X trim coil 278C constitute an X trim adjustment motor 285A for placing the X-axis frame member 282A and the base 244 into a predetermined X-axis position. A second X trim adjustment motor 285B is similar in construction and function and is located on the X-axis frame member 282B opposite to the X trim adjustment motor 285A.

FIG. 9 further illustrates the first guide bar 246 provided with the wafer stage WST1 movable along the first guide bar 246 in the X-axis direction. The wafer stage WST1 includes a stage body ST1 serving as a first stage, a substrate table TB1 supportingly floated above the stage ST1 in a non-contact manner. The first guide bar 246 extends in the X-axis direction, and an X coil 290A serving as a first stationary member is fixed on the first guide bar 246. The stage body ST1 of the wafer stage WST1, has a side view shaped like a Greek character "σ." A portion of the first stage body ST1 is disposed above the first guide bar 246 and the remaining portion protrudes toward one side in the +Y-axis direction, such that the first stage WST1 overhangs and is cantilevered from an X-axis longitudinal center of the first guide bar 246. The amount of overhang by the cantilevered portion of the first stage WST1 is less than the amount of overhang of the first stage WST1 as shown in FIG. 6B. The reduction in the amount of cantilevered overhang reduces the size of the base plate 244, and thus the overall size of the stage device 212 of the exposure apparatus. Accordingly, the size of the base plate 44 of the stage device 12 in the first embodiment is larger than the base plate 244 of the stage device 212 in the second embodiment. Synchronized movement of the wafer stages WST1, WST2 will be discussed later.

The stage body ST1 of this second embodiment is also capable of minute adjustments in the X, Y and $\theta_Z$ directions similar in operation to the stage body ST1 of the first embodiment shown in FIG. 6B. The X magnet 204 located inside the wafer stage ST1 and the X coil 290A on the first guide bar 246 constitute an X-axis linear motor 220A, or first driving device, similar in function to the X-axis linear motor shown in FIGS. 6A and 6B. Wafer stage ST2 is driven in the X-axis direction along the second guide bar 248 by an X-axis linear motor (not shown), or second driving device, similar in function to the X-axis linear motor 220A.

The point of action of the linear motor 220A in the X-axis direction is set at the center of gravity of the wafer stage WST1. In the X-axis direction, the point of action force produced by the linear motor 220A is at the same Z position as the center of gravity G of the stage WST1. Also, at least one X direction non-contact bearing 208 is disposed between the guide bar and the stage WST1 and is also disposed in line with the center of gravity G of the stage WST1. For this reason, it is possible to effectively restrain the wafer stage WST1 from yawing (rotating on the Z-axis) and rolling (rotating on the Y-axis) when being driven in the X-axis direction.

The substrate table TB1, serving as a first table is supportingly floated on the stage body ST1. The substrate table TB1 and the stage body ST1 are minutely driven such that the substrate table TB1 is movable relative to the stage body ST1 in six degree-of-freedom directions, X, Y, Z, $\theta_X$, $\theta_Y$, $\theta_Z$. The substrate table TB1 is supported in a non-contact manner similar to the manner in which the table TB1 is supported in FIG. 6B.

Disposed around the wafer table TB1 of the wafer stage WST1 are multiple movable mirrors 242A, 242B, 242C. A wafer W1 is fixed on the upper surface of the substrate table TB1 via a wafer holder (not shown) by electrostatic attraction or a vacuum attraction. A second wafer stage WST2 similar in construction to the first wafer stage WST1 is also provided, except that it is a mirror image. The movable mirrors 242A, 242B and 242C are part of an interferometer system, which has been described previously, wherein interferometric beams are reflected so as to measure the amounts of displacement of the reflecting surfaces from reference positions.

Various non-contact bearings can be used with any of the preferred embodiments, including but not limited to: vacuum preload hydrostatic gas bearings and electromagnetic bearings. The bearings enable adjacent parts to be supportingly floated in a non-contact manner. For example, in the case where gas bearings are used, the parts are floated by static pressure of compressed gas (e.g., hydrogen or helium) jetted from the gas bearings. The non-contact bearings are disposed in various location. For example, non-contact bearings 208 are located between the bottom surface of the first ST1 and second ST2 stage bodies and the upper side of the base 244. The first and second guide bars 246 and 248 are supported at a predetermined X-axis position in a non-contact manner by non-contact bearings 208 disposed between the lower mounting member 256B and the base 244. Non-contact bearings 208 are also disposed in the Y direction between the inner portions 208A of the first ST1 and second ST2 stage bodies, and the outer adjacent surfaces of the first guide bar 246 and second guide bar 248.

The various components of the stage device 212 of the second embodiment of the exposure apparatus are electrically connected to the main control device 16 in a manner similar to the stage device 12 described before in the first embodiment. The stage control device 38 manages the movements of the wafer stages WST1 and WST2 according to directions from the main control device 16.

Third Embodiment

Figure 10:
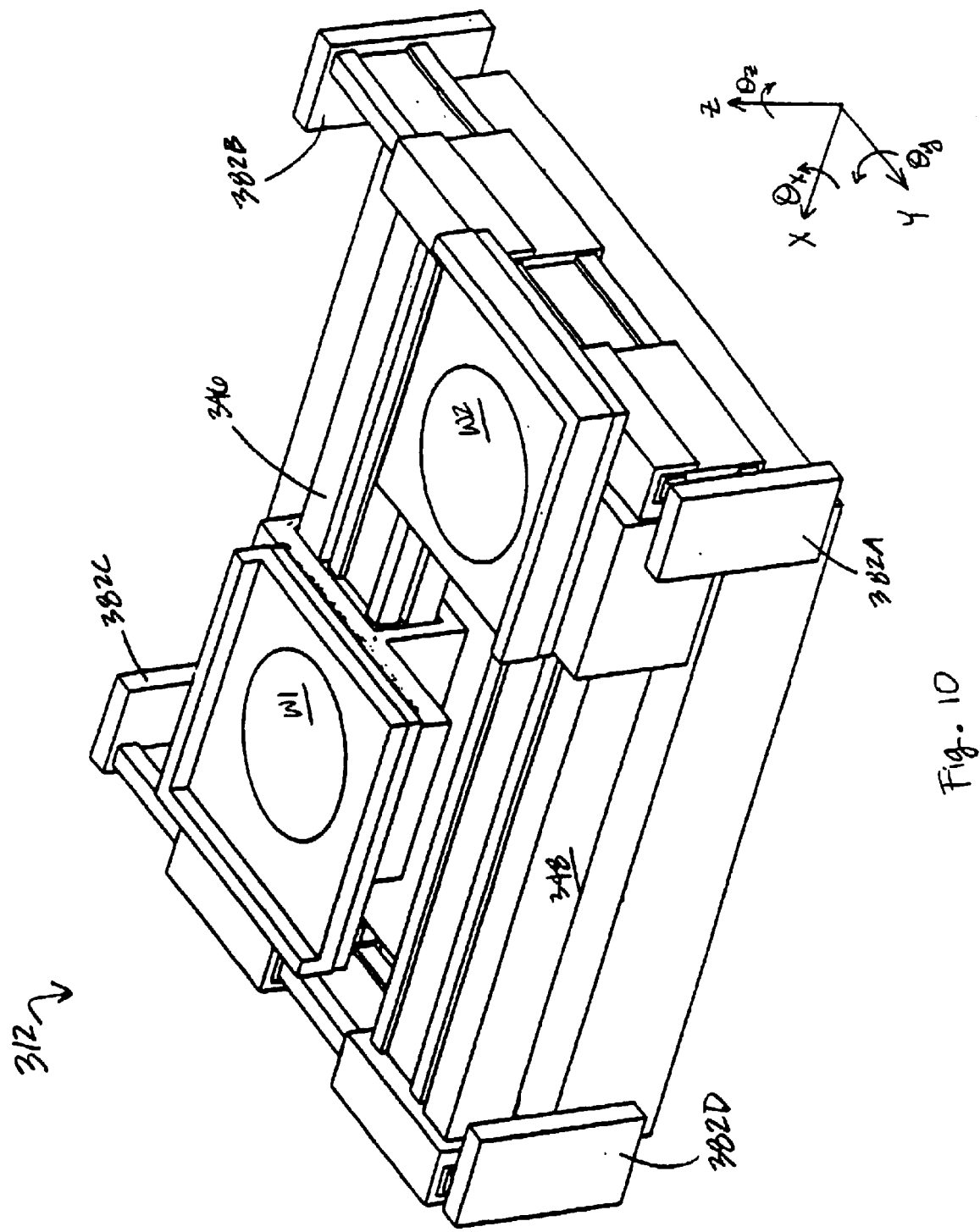
FIG. 10 is a perspective view showing a third embodiment of the stage device of the invention.
Figure 11:
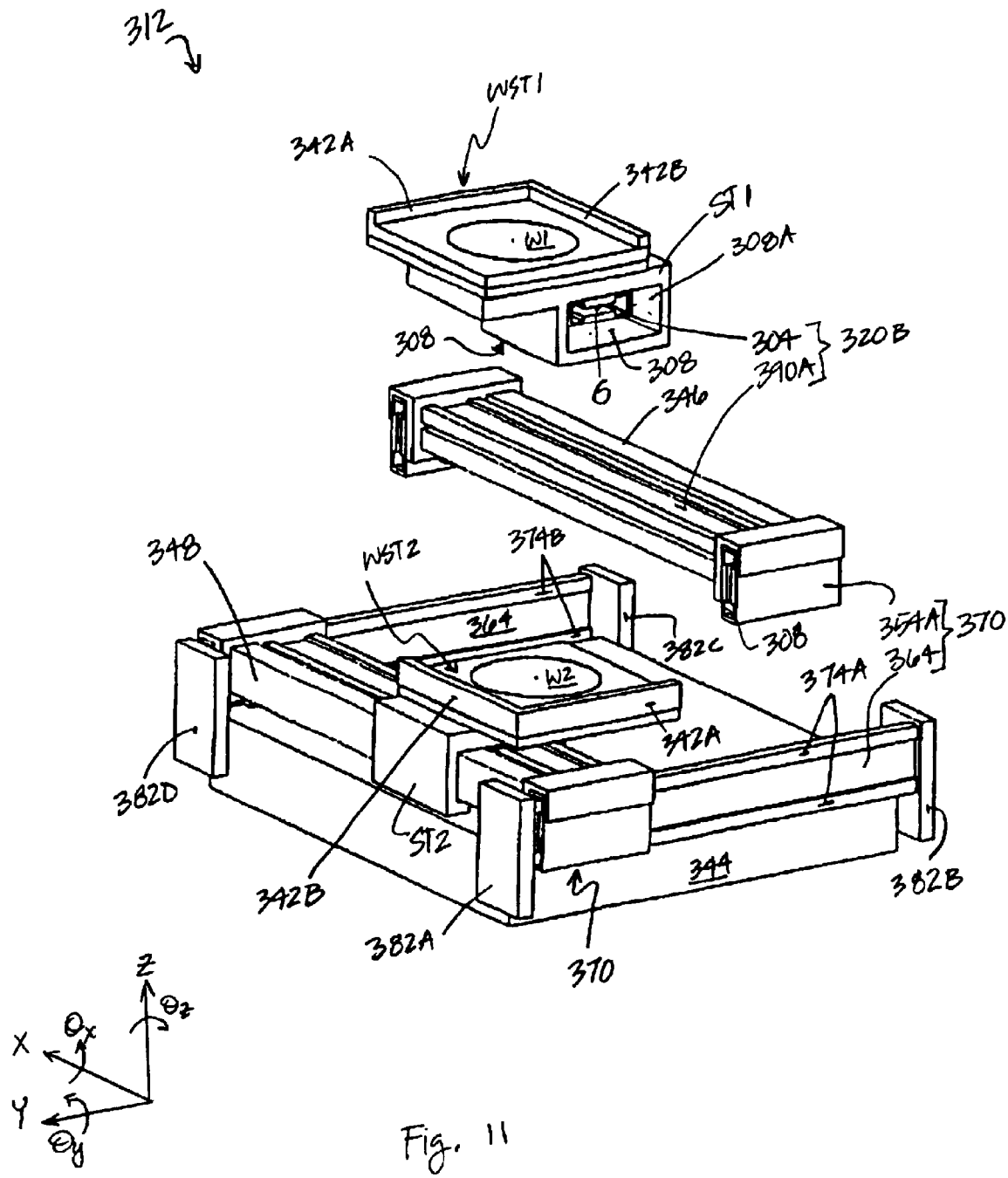
FIG. 11 is an enlarged, exploded view of a part of the stage device shown in FIG. 10.

FIG. 10 is a perspective view illustrating a third embodiment of the stage device 312. The third embodiment has a construction similar to that of the second embodiment shown in FIGS. 8–9, but differs as follows. Referring to FIG. 11, the configuration of the X magnet 304 and the Y magnet 354A, the X coil 390A and Y coil 364, and the reaction frame supports 382A, 382B, 382C and 382D are different from the previous embodiments. The components of the stage device 312 will be described below in detail mainly with reference to FIGS. 10 and 11, and appropriately with reference to other figures.

FIGS. 10 and 11 illustrate the stage device 312 including a base plate 344, a first guide bar 346 and a second guide bar 348 supportingly floated above the upper surface of the base plate 344 so as to move in the Y-axis direction. Wafer stages WST1 and WST2, which hold wafers W1 and W2, are movable in the X-axis direction along the first guide bar 346 and the second guide bar 348, respectively.

Specifically, four reaction frame supports 382A, 382B, 382C and 382D are disposed adjacent to each of the corner edges of the base 344. Each of the reaction frame supports 382A, 382B, 382C, 382D can be isolated from the base 344 to prevent the transfer of, e.g., a reaction force from the reaction frame supports 382A, 382B, 382C, 382D to the base 344. Two of the reaction frame supports 382A and 382B are connected by frame guides 374A, which extend in the Y-axis direction. The other two reaction frame supports 382C and 382D are connected by two additional frame guides 374B which also extend in the Y-axis direction.

Referring to FIG. 11, the stage body ST1 is capable of minute adjustments in the X, Y and $\theta_Z$ directions similar to the operation of the stage of the first embodiment shown in FIG. 6B. The X magnet 304 in the wafer stage body ST1 and the X coil 390A on the first guide bar 346 constitute an X-axis linear motor 320B (first driving device) similar in function to the X-axis linear motor shown in FIGS. 6A and 6B. Wafer stage WST2 is driven in the X-axis direction along the second guide bar 348 by another X-axis linear motor (not shown), which is similar in construction to the first driving device and serves as a second driving device.

A Y-axis linear motor 370 (or third driving device) includes a Y magnet 354A and a Y coil 364. The Y magnet 354A is constructed in the shape of a sleeve having a cylindrical rectangular shaped XZ cross section. At least a portion of the rectangular sleeve (or Y magnet 354A) is attached to the first guide bar 346. The Y coil 364 is bordered by the two frame guides 374A and extends longitudinally (in the Y direction) between two reaction frame supports 382A and 382B. The rectangular sleeve shaped Y magnet 354A encircles the Y-coil 364 and frame guides 374A and translates in the Y direction. The Y magnet 354A and the Y coil 364 are opposed thereto and constitute a moving magnet type Y-axis linear motor 370. The Y magnet 354A and the Y coil 364 operate similar to the Y-axis linear motors 70A and 70B described above. Disposed at the ends of the second guide bar 348 are Y-axis linear motors 370 which are similar in construction and operation with the above described Y-axis linear motors 270 of the first guide bar 246.

FIG. 11 further illustrates the first guide bar 346 provided with the wafer stage WST1 movable along the first guide bar 346 in the X-axis direction. The wafer stage WST1 includes a stage body ST1 serving as a first stage. A substrate table TB1 is supportingly floated above the stage body ST1 in a non-contact manner. The first guide bar 346 extends in the X-axis direction, and an X coil 390A serving as a first stationary member is fixed on the first guide bar 346. The stage body ST1 of the wafer stage WST1, has a side view shaped like a Greek character "σ." The uppermost portion of the wafer stage body ST1 is disposed above the first guide bar 346. A portion of the first stage body ST1 lies above the first guide bar 346 and the remaining portion protrudes in an overhanging construction (in the +Y-axis direction) away from the first guide bar 346 such that the first stage WST1 is cantilevered from an X-axis longitudinal center of the first guide bar 346. The amount of overhang of the stage body ST1 that is cantilevered is substantially less than the amount of overhang of the stage body ST1 of the first embodiment as shown in FIG. 6B.

In this third embodiment, the reduction in the amount of cantilevered overhang reduces the overall size of the stage device, and the footprint required for alignment and exposure of the wafers stages WST1, WST2. Thus, the size of the stage device 12 in the first embodiment is larger than the stage device 312 in the third embodiment. Synchronized movement of the wafer stages WST1 and WST2 will be discussed later.

The point of action of the driving direction in the X-axis direction is set at the center of gravity G of the wafer stages WST1, WST2. For example, in the X-axis direction, the point of action force produced by the linear motor 320A is at the same Z position as the center of gravity G of the stage WST1. Also, at least one X direction non-contact bearing 308 is disposed between the guide bar and the stage WST1 and is also disposed in line with the center of gravity G of the stage WST1. For this reason, it is possible to effectively restrain the wafer stages WST1, WST2 from yawing (rotating on the Z-axis) and rolling (rotating on the Y-axis) when being driven in the X-axis direction.

Disposed about the wafer stage WST1 are multiple movable mirrors 342A and 342B. A wafer W1 is also fixed on the upper surface of the substrate table TB1 via a wafer holder (not shown) by electrostatic attraction or a vacuum attraction. A second wafer stage WST2 has a structure similar in construction to the first wafer stage WST1, except that it is laterally reversed. Movable mirrors 342A and 342B are part of an interferometer system, which has been described previously, wherein interferometric beams are reflected so as to measure the amounts of displacement of the reflecting surfaces from reference positions.

Various non-contact bearings, including but not limited to: vacuum preload hydrostatic gas bearings and electromagnetic bearings may be disposed in various location of the stage device 312. For example, non-contact gas bearings 308 are located between the bottom surfaces of the first and second stage bodies ST1, ST2 and the base 344. Non-contact gas bearings 308 are also disposed between the outer surface of the Y guides 374A and 374B and the inner surface of the Y magnet 354A. Non-contact gas bearings 308 are also be disposed in the Y direction between the inner portion of the first and second stage bodies ST1, ST2, and the outer adjacent surfaces of the first and second guide bars 346, 348, respectively.

The various components of the stage device 312 of the third embodiment of the exposure apparatus are electrically connected to the main control device 16 in a manner similar to the stage device 12 described before in the first embodiment. The stage control device 38 manages the movements of the wafer stages WST1 and WST2 according to directions from the main control device 16.

Fourth Embodiment

Figure 12A:
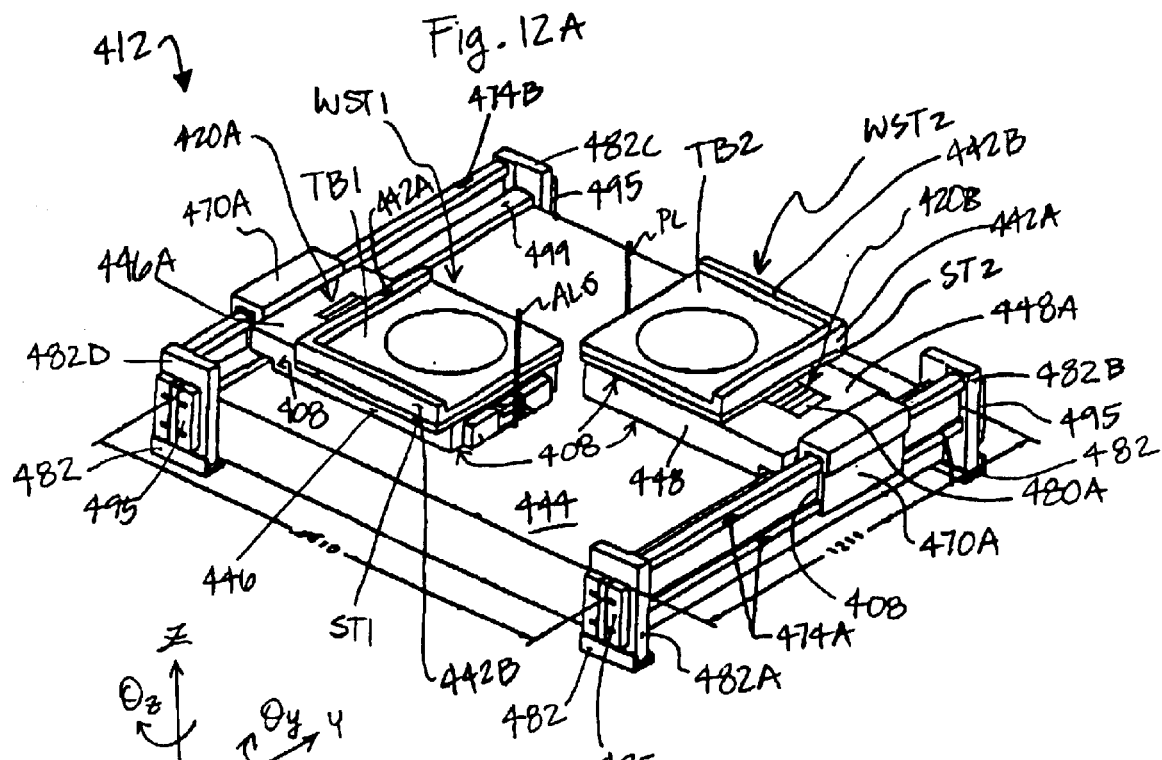
FIG. 12A is a perspective view showing a fourth embodiment of the stage device of the invention.

FIG. 12A is a perspective view illustrating a fourth embodiment of the stage device 412. The fourth embodiment has a construction similar to that of the third embodiment shown in FIGS. 10–11, but differs as follows. In this embodiment, the configuration of the first guide bar 446 and the second guide bar 448 are different from previous embodiments. The first and the second guide bars 446, 448, do not extend across the entire length of the base 444 of the stage device 412. Further, the first and second guide bars 446, 448 are magnetically driven by a Y-axis linear motor 470A from only one end. Additionally, anti-torque actuators 495 are provided for counteracting torque that results when force is applied to the driven ends 446A, 448A of the first and second guide bars 446, 448. The components of the stage device 412 will be described below in detail mainly with reference to FIGS. 12A and 12B, and as appropriate with reference to other figures.

FIG. 12A illustrates a stage device 412 including a base plate 444, a first guide bar 446 and a second guide bar 448 are supportingly floated above the upper surface of the base plate 444 so as to move in the Y-axis direction. Wafer stage bodies ST1 and ST2, which hold substrate tables TB1 and TB2, are movable in the X-axis direction along the first guide bar 446 and the second guide bar 448, respectively. Wafers W1 and W2 are fixed on the upper surface of the substrate tables TB1, TB2 of the first and second wafer stages WST1 and WST2 via a wafer holder (not shown) by electrostatic attraction or a vacuum attraction. The first guide bar 446 and the second guide bar 448 differ from the previous embodiments in that they are magnetically coupled and driven at only one end 446A, 448A of the first and second guide bars 446, 448. Only a single Y-axis linear motor 470A (or third driving device) is provided for each of the guide bars 446, 448.

FIG. 12A illustrates four reaction frame supports 482A, 482B, 482C and 482D, similar in construction and operation to the four reaction frame supports 382A, 382B, 382C and 382D of the third embodiment. That is, two of the reaction frame supports 482A and 482B are connected by frame guides 474A, which extend in the Y-axis direction, and another pair of reaction frame supports 482C and 482D are connected by two frame guides 474B, which also extend in the Y-axis direction. Additionally, this fourth embodiment includes an anti-torque actuator 495. The anti-torque actuator 495 will be described in detail later.

Figure 12B:
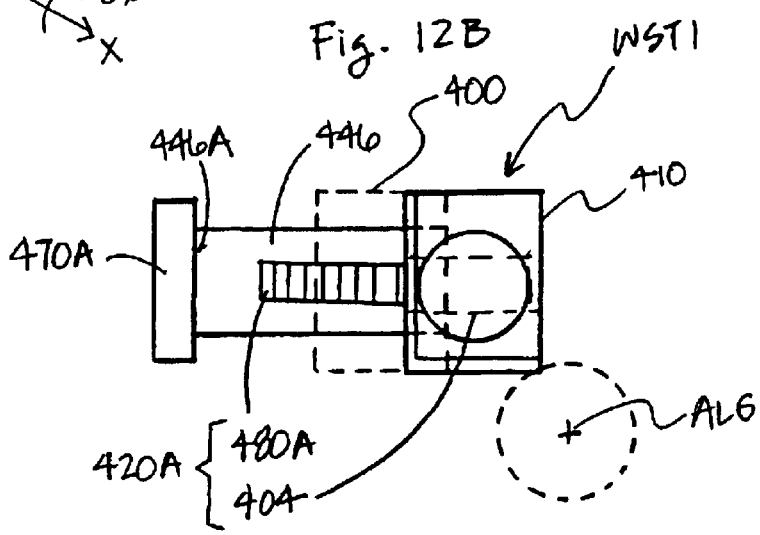
FIG. 12B is a simplified plan view of one wafer stage of FIG. 12A in an extended position.

FIG. 12B is a simplified partial plan view illustrating the construction and operation of the first wafer stage WST1. The configuration of the first linear motor 420A in this embodiment is different from the first linear motor shown in the previous embodiments. The X-axis linear motor 420A is comprised of an X magnet 404 (shown in hidden line in FIG. 12B) and an X coil 480A. The X magnet 404 is disposed on the lower surface of the first stage body ST1 and the X coil 480A is disposed on the upper surface of the first guide bar 446. The X magnet 404 and the X coil 480A are magnetically coupled to each other. The X magnet 404 and the X coil 480A constitute an X-axis linear motor 420A (first driving device) similar in function to the X-axis linear motor illustrated in FIGS. 6A and 6B. Similarly, wafer stage body ST2 is provided with an X-axis linear motor 420B for driving the second wafer stage WST2 in the X-axis direction parallel to and along the second guide bar 448 by the X-axis linear motor 420B serving as a second driving device. This configuration is more compact then the previously described embodiments because the lengths of the first guide bar 446 and the second guide bar 448 are substantially reduced.

Referring again to FIG. 12A, the Y-axis linear motors 470A (or third driving device) are similar in design and function to the Y-axis linear motors 370A described above in FIGS. 10–11. Since the stage body ST1 is driven in the Y direction under the force of the third driving device 470A, which applies force to only one end of the first guide bar 446, torque is produced. To counteract this torque, an anti-torque actuator 495 is provided adjacent to the reaction frame support members 482A, 482B, 482C, 482D. The anti-torque actuator 495 operates in combination with guide surfaces 499 to apply counteracting torque to the first and second guide bars 446, 448. The reaction frame supports 482A, 482B, 482C, 482D are provided on X guides 482 that allow reaction frame supports 482A, 482B, 482C, 482D to move in the X direction. The anti-torque actuator 495 is then driven to counteract this motion. As a result, the only torque transmitted to the floor, or the rest of the machine, is produced by the anti-torque actuators 495. A controller is electrically connected to the stage device 412 to sense and determine reaction torque forces induced by the ends 446A, 448A of the guide bars 446, 448 as a result of having only one of the respective ends driven. For this reason, it is possible to effectively restrain the wafer stages WST1 and WST2 from yawing (rotating about the Z-axis) when being driven in the Y-axis direction.

FIG. 12A illustrates the first guide bar 446 provided with the wafer stage body ST1, which is movable along the first guide bar 446 in the X-axis direction. The substrate table TB1 is supportingly floated above the stage body ST1 in a non-contact manner. The stage body ST1 is capable of minute adjustments in the X, Y and Z direction similar in operation to the stage shown in FIG. 6B. An X coil 480A serving as a first stationary member is fixed on the first guide bar 446.

FIG. 12A shows the stage body ST1 in a retracted position 400 (also shown in broken line in FIG. 12B). When the stages are in the fully retracted position, the stages can pass each other in the Y direction. The stage body ST1 is capable of extending such that a portion of the stage body ST1 overhangs and is cantilevered beyond the end face of the first guide bar 446. See, for example, FIG. 12B. FIG. 12B illustrates the wafer stage WST1 in an extended position 410. In this view, the X coil 480A is shown in solid lines and the X magnet 404 is shown in hidden lines.

The reduction in the length of the first guide bar 446 and the second guide bar 448 effectively reduces the overall size of the stage device. Accordingly, the size of the stage device 12 in the first embodiment (see FIG. 3) is larger than the stage device 412 in this fourth embodiment. Synchronized movement of the wafers W1 and W2 will be discussed later.

Disposed on the wafer stage WST1 are multiple movable mirrors 442A and 442B. The movable mirrors 442A and 442B constitute part of an interferometer system such that interferometric beams are reflected so as to measure the amount of displacement of the reflecting surfaces from reference positions. The interferometer system has been described previously.

Non-contact bearings, including but not limited to: vacuum preload hydrostatic gas bearings and electromagnetic bearings may be disposed in various locations of the stage device 412. For example, non-contact gas bearings 408 are located between the bottom surface of the first stage body ST1 and the upper surface of the base 444 and between the bottom surface of the second stage body ST2 and the upper surface of the base 444. Non-contact air bearings 408 are disposed between the bottom surface of the first guide member 446 and the base 444 and between the bottom surface of the second guide member 448 and the base 444. Non-contact gas bearings 408 are disposed between the inner surface of the guide surface 499 and the adjacent outer surface of the first guide member 446 and between the inner surface of the guide surface 499 and the adjacent outer surface of the second guide member 448.

The components of the exposure apparatus are connected to the main control device 16 in a manner similar to the embodiments previously described. The stage control device 38 manages the movements of the wafer stages WST1 and WST2 according to directions from the main control device 16.

Synchronization of Alignment and Exposure Procedure

The disclosed embodiments provide stage devices that are compact. However, in order to reduce the overall size of the stage device of an exposure apparatus and the footprint required for the exposure operation (exposure sequence) and the alignment operation (alignment sequence), it is desirable to appropriately synchronize the movement of the wafer stages WST1 and WST2. By synchronizing the movement of the first wafer stage WST1 and the second wafer stage WST2, improved throughput and accuracy of the concurrent processing is achieved.

The exposure apparatus 10 and 210 shown in FIGS. 14A and 14B, respectively, include a single alignment microscope ALG for detecting alignment marks (position detection marks) formed on the wafer on each of the stage bodies ST1, ST2 when the stage body is moved into a predetermined area (area adjacent to and below the alignment microscope ALG), and a single projection optical system PL for projecting exposure illumination light onto the wafer on each of the wafer stages WST1 and WST2 when the stage body is moved into the predetermined exposure area. That is, since the wafer stages WST1 and WST2 are interchangable in the exposure apparatus 10 and 210, one alignment microscope and one projection system are sufficient. Therefore, it is possible to reduce the size (length in the X-axis direction) of the exposure apparatus including the wafer chamber 42, and to thereby reduce the footprint. Further, in FIG. 14B, since the overhang cantilever length of the wafer stages WST1 and WST2 is reduced in size, the length of the base 244 in the Y-axis direction can also be reduced. Additionally, since wafers W1, W2 on the wafer stages are replaced at one position, the opening (area of the opening) of the wafer chamber 42 can be reduced, and the purity of helium gas in the wafer chamber 42 is prevented from being decreased.

FIG. 14A is a partial top view of the first embodiment as shown in FIG. 3 and FIG. 14B is a partial top view of the second embodiment as shown in FIG. 8. FIGS. 14A and 14B illustrate the difference in size between the overhang cantilever length C1 of the wafer stage WST1 of the first embodiment and the overhang cantilever length C2 of the wafer stage WST1 of the second embodiment.

In FIG. 14A, the length L1 and the width D1 of the base 44 and the overhang cantilever length C1 provided by wafer stage WST1 in the first embodiment are sufficiently large to allow each of the wafer stages WST1 and WST2 to operate concurrently and independently of one another. That is, exposure and alignment of the wafers W1 and W2, anywhere above or below a centerline CL1, is possible at any time during the exposure or the alignment operations. Specifically, it is possible for the exposure operation to take place at the uppermost region +W2 (+Y direction from the centerline CL1) of the wafer W2 while simultaneously performing an alignment operation in the lowermost region −W1 (−Y direction from the centerline CL1) of wafer W1.

The extreme inverse position is also possible in the exposure apparatus 10 of FIG. 14A. That is, it is possible for the exposure operation to take place at the lowermost region −W2 (−Y direction from the centerline CL1) of the wafer W2 while simultaneously performing an alignment operation in the uppermost region +(+Y direction from the centerline CL1) of wafer W1. To allow concurrent and independent movement between the first wafer stage WST1 and the second wafer stage WST2, a generous distance is provided between the first guide bar 46 and the second guide bar 48 of the exposure apparatus 10 of FIG. 14A. However, when it is desirable to reduce the size of the stage device and the footprint required for exposure and alignment operation, the movement of the first wafer stage WST1 and the second wafer stage WST2 must be synchronized.

In FIG. 14B, the length L2 and width D2 of the base 244 and the overhang cantilever length C2 of the wafer stages WST1 and WST2 are significantly shorter than that of the first embodiment illustrated in FIG. 14A. The compact construction of the second embodiment limits the ability of the wafer stages WST1 and WST2 from acting independently. Accordingly, the movement of the wafer stage WST1 and wafer stage WST2 must be synchronized. That is, the movement of the exposure and the alignment operations of the wafer stages WST1 and WST2 is synchronized into designated regions either above (+W1, +W2) or below (−W1, −W2) the centerline CL2.

Referring to FIG. 14B for example, when an exposure operation is performed in the uppermost region +W2 (+Y direction from the centerline CL2) of the wafer W2, it is desirable to simultaneously synchronize the alignment operation of the wafer W1 on wafer stage WST1 in the uppermost region +W1 (+Y direction from the centerline CL2) of wafer W1. Similarly, in the inverse position, when an exposure operation is performed at the lowermost region −W2 (−Y direction from the centerline CL2) of the wafer W2 on wafer stage WST2, it is desirable to simultaneously synchronize the alignment operation of the wafer W1 in the lowermost region −W1 (−Y direction from the centerline CL2) of wafer W1. The compact size of the base 244 and the limited operating distance between the first 246 and second 248 guide bars in the second embodiment requires that the exposure and alignment operations of the wafers W1 and W2 be synchronized to operate in similar regions, either above (+W1, +W2) or below (−W1, −W2) the centerline CL2 simultaneously. Alternatively, the similar regions may be defined in both wafers W1 and W2 as a region near, or adjacent to, the centerline CL2. The configuration of the stage device 210 described above is given merely as an example and is not intended to be limiting.

Synchronized movement of the wafer stages WST1 and WST2 is electrically controlled by the main control device 16 and the stage control device 38 similar in operation to the second embodiment described above.

In the exposure apparatus 210 of this embodiment, wafer replacement and alignment is performed on a wafer on one of the substrate tables concurrently with exposure of a wafer on the other substrate table. If the alignment operation of the first wafer stage WST1 is completed earlier than the exposure operation of the second wafer stage WST2, the first wafer stage WST1 is put on standby until the second wafer stage WST2 has completed its exposure operation. When both operations are completed, the wafers on the wafer stages WST1 and WST2 are switched by interchanging their relative alignment and exposure positions.

Switching Stage Configuration Sequence

Now, referring to FIGS. 13A–13D, rapid exposure of wafers is desirable in an exposure apparatus. The faster that an exposed wafer (positioned under an exposure lens) can be replaced with an aligned wafer (located under an alignment lens), the greater the efficiency and throughput. The switching stage configuration sequences referred to in FIGS. 13A–13C are provided in view of the embodiments described above. The object of illustrating the following sequences is to provide a method and apparatus for increasing the interchange and thus the manufacturing throughput of wafers. The first wafer stage WST1 is labeled "1" and wafer stage WST2 is labeled "2."

Upon completion of the exposure and alignment of the first WST1 and second WST2 wafer stages, respectively, the stages WST1, WST2 are interchanged, or switched, such that the first wafer stage WST1, which has just completed exposure is removed from underneath the exposure lens and the second wafer stage WST2 which has just completed alignment is then positioned under the exposure lens for exposure. The wafer which has just completed exposure WST1 is then moved to a position adjacent the wafer loader chamber 50 (shown in FIG. 3) so that the exposed wafer can be replaced with a new wafer to be aligned.

Referring to FIGS. 13A–13C, various switching stage sequences are illustrated. The length and width of a wafer stage table are not necessarily equal, but will be assumed to be equal in order to simplify the description. Different switching sequences will require different areas (and thus different sized bases) in order to accomplish that sequence. The sequence of FIG. 13A requires an area of approximately 3×3 (=9) times the area of a water stage (is assumed that stages WST1 and WST2 are the same size). Thus, the FIG. 13A sequence requires a base of size 3×3 WS, where WS is the size of a stage. The FIG. 13B sequence requires an area of approximately 2×3 WS, while the FIG. 13C sequence requires an area of approximately 2×2 WS.

In FIGS. 13A–13C, the uppermost reference position marker (shown as an encircled cross) corresponds to the center of the optical axis of the projection optical system PL (that coincides with the center of the projection of a reticle pattern image), and the lowermost reference position marker (shown as a second lower encircled cross) corresponds to the center axis of the alignment microscope ALG or FIA (Field Image Alignment) type sensor that measures the positions in the X and Y two-dimensional directions of the fiducial marks on the fiducial mark plate and alignment marks on the wafers. Scanning is performed in the X-axis direction (I) and stepping is performed in the Y-axis direction (II).

A. Base Size of 3×3 WS

Referring to FIG. 13A, rapid switching of wafer stages occurs in as few as one step. Initially, WST1 and WST2 are disposed adjacent to each other in the X-direction.

In step 1, WST1 and WST2 are simultaneously moved one wafer stage length in the +X-direction. Thus, WST1 is removed from under the exposure lens and WST2 is located below the exposure lens for exposure thereby. Immediately, exposure can begin on WST2. Thereafter, WST1 is replaced with a new wafer and aligned in the following manner.

In step 2, WST1 is moved one wafer stage length in the +Y-direction.

In step 3, WST1 is moved two wafer stage lengths in the −X-direction to a position adjacent to the wafer loader chamber 50 for replacement with a new unexposed wafer.

In step 4, WST1 is moved one wafer length in the −Y-direction into position under the alignment lens ready for alignment.

Since the exposure procedure is longer than the alignment and replacement procedure, both alignment and replacement are generally completed before the concurrent exposure procedure has been completed.

Upon completion of exposure of WST2 and alignment of WST1, the steps listed above are repeated in sequence as described above. However, as the switching process is repeated for the second stage, the motion of the stages is reversed with respect to the Y direction. In this manner, the stages do not exchange places from left-to-right.

B. Base Size of 2×3 WS

FIG. 13B illustrates a second switching stage configuration sequence for an exposure apparatus having a base size of 2×3 WS. The wafer stage in this configuration is more compact than the first configuration. However, the time necessary to place an aligned wafer stage under the exposure lens is greater. Thus, the time required to initiate exposure is longer. However, increased efficiency and manufacturing throughout are also possible with this compact configuration. In addition, it is easier to make a more precise base plate if the size of the base plate is smaller.

Referring to FIG. 13B, rapid switching of wafer stages occurs in as few as two steps. Initially, WST1 and WST2 are aligned as in FIG. 13A.

In step 1, WST1 is moved one wafer stage length in the +Y-direction.

In step 2, WST2 is moved one wafer stage length in the +X-direction into position under the exposure lens ready for exposure thereby. Immediately, exposure can begin on WST2. Thereafter, WST1 is replaced with a new wafer and aligned in the following manner.

In step 3, concurrent or subsequent with step 2, WST1 is moved one wafer stage length in the −X-direction to a position adjacent to the wafer loader chamber 50 for replacement with a new unexposed wafer.

In step 4, WST1 is moved one wafer stage length in the +Y-direction into position under the alignment lens ready for alignment.

Since the exposure procedure is longer than the alignment and replacement procedures, both alignment and replacement are generally completed before the concurrent exposure procedure has been completed.

Upon completion of the exposure of WST2 and the alignment of WST1, the stages are again switched such that the stage WST2 which has been exposed is then moved to a position so that the exposed wafer can be replaced with a new wafer to be aligned. In addition, the wafer that has been aligned on WST1 can then be moved into the exposure position for exposure. To complete this switching process, the steps listed above are repeated in sequence as described above. Specifically, as the switching process is repeated for the second stage, the motion of the stages is reversed with respect to the Y direction. In this manner, the stages do not exchange places from left-to-right.

C. Base Size of 2×2 WS

FIG. 13C illustrates a third switching stage configuration sequence for an exposure apparatus having a base size of 2×2 WS. The wafer stage in this configuration is even more compact than the first and second configurations. However, the time necessary to place an aligned wafer stage under the exposure lens is even greater.

Referring to FIG. 13C, rapid switching of wafer stages occurs in as few as three steps. Initially, WST1 is staggered by half a wafer stage length in the +Y-direction with respect to WST2.

In step 1, since WST1 is already staggered by half a wafer stage length in the +Y-direction, WST1 is only moved another half a wafer stage length in the +Y-direction.

In step 2, WST2 is moved one stage length in the −X-direction and WST2 is concurrently moved one stage length in the +X-direction.

In step 3, WST2 is moved half a wafer stage length in the +Y-direction into position under the exposure lens ready for exposure thereby, WST1 is concurrently moved one wafer stage length in the -Y-direction adjacent to the wafer loader chamber 50 for replacement with a new unexposed wafer. Immediately, exposure can begin on WST2.

Thereafter, WST1 is replaced with a new wafer and aligned in the following manner.

In step 4, after the wafer loader 50 replaces the exposed wafer with a new unexposed wafer, WST1 is then moved half a wafer stage length in the +Y-direction into position under the alignment lens ready for alignment.

Upon completion of the exposure of WST2 and the alignment of WST1, the stages are again switched. Stage WST2 which has just finished exposure is moved to a position so that the exposed wafer can be replaced with a new wafer that is to be aligned. In addition, the wafer which has just finished alignment (WST1) can then be moved into the exposure position for exposure thereon. To complete this switching process, the steps listed above are repeated in sequence as described above. That is, as the switching process is repeated for the second stage, the motion of the stages is reversed with respect to the Y direction. In this manner, the stages do not exchange places from left-to-right.

With respect to any of the three switching sequences described above, where space permits, many of these steps can be simultaneously performed thereby increasing the switching speed.

FIG. 13D is a table illustrating a comparison of the three separate switching stage sequences. The first row refers to the first sequence of FIG. 13A. The minimum operable base size required for this first sequence is approximately 3×3 WS. The minimum number of switching strokes required before exposure can begin is at least one wafer stage distance (WS). That is, in one step, the stage which has just completed exposure is removed from underneath the exposure lens and the wafer which has been aligned is simultaneously positioned under the exposure lens for exposure.

In the sequence of FIG. 13B the minimum operable wafer stage base size required for this second sequence is 2×3 WS. The minimum number of switching strokes required before exposure can begin is at least two wafer stage distances (WS+WS) as described above.

In the sequence of FIG. 13C, the minimum operable base size required for this third sequence is 2×2 WS. The minimum number of switching strokes required before exposes can begin is at least one half a wafer stage plus one wafer stage distance plus one half a wafer stage (½ WS+WS+½ WS).

In the illustrated embodiment, the main control device 16 is implemented as a programmed general purpose computer. It will be appreciated by those skilled in the art that the controller can be implemented using a single special purpose integrated circuit (e.g., ASIC) having a main or central processor section for overall, system-level control, and separate sections dedicated to performing various different specific computations, functions and other processes under control of the central processor section. The controller can be a plurality of separate dedicated or programmable integrated or other electronic circuits or devices (e.g., hardwired electronic or logic circuits such as discrete element circuits, or programmable logic devices such as PLDs, PLAs, PALs or the like). The controller can be implemented using a suitably programmed general purpose computer, e.g., a microprocessor, microcontroller or other processor device (CPU or MPU), either alone or in conjunction with one or more peripheral (e.g., integrated circuit) data and signal processing devices. In general, any device or assembly of devices on which a finite state machine capable of implementing the procedures described herein can be used as the controller. A distributed processing architecture can be used for maximum data/signal processing capability and speed.

While the invention has been described with reference to preferred embodiments thereof, it is to be understood that the invention is not limited to the preferred embodiments or constructions. To the contrary, the invention is intended to cover various modifications and equivalent arrangements conceived by those skilled in lithographic systems. In addition, while the various elements of the preferred embodiments are shown in various combinations and configurations, which are exemplary, other combinations and configurations, including more, less or only a single element, are also within the spirit and scope of the invention.

What is claimed is:

1. A switching-motion twin stage device having a first cantilevered stage and a second cantilevered stage, comprising:

a first driving device having a first moving member and a first stationary member that drives the first cantilevered stage in a first direction;

a second driving device having a second moving member and a second stationary member that drives the second cantilevered stage in the first direction;

a first table disposed on the first cantilevered stage to hold a first sample;

a second table disposed on the second cantilevered stage to hold a second sample;

a first guide bar provided with the first stationary member that movably supports one side of the first cantilevered stage;

a second guide bar provided with the second stationary member that movably supports one side of the second cantilevered stage, the second guide bar provided at a predetermined distance from the first guide bar in a second direction orthogonal to the first direction; and a controller that performs a switching of a position of the first table and the second table without divorcing between the first table and the first cantilevered stage, and between the second table and the second cantilevered stage, the controller being coupled to the first and second driving devices to move the second cantilevered stage in a direction opposite to the direction of movement of the first cantilevered stage to perform the switching of the positions of the first and second tables.

2. A switching-motion twin stage device according to claim 1, further comprising:

a third driving device for driving at least one of the first guide bar and the second guide bar in the second direction.

3. A switching-motion twin stage device according to claim 2, wherein the third driving device drives the at least one of the first guide bar and the second guide bar at both ends.

4. A switching-motion twin stage device according to claim 2, wherein the third driving device further comprises:

an armature unit having at least one magnet; and a magnetic pole unit having an armature coil that is magnetically coupled to the armature unit, wherein the controller controls a yawing and a rolling of at least one of the first and second guide bars along at least one of the first and second directions in a non-contact manner.

5. A switching-motion twin stage device according to claim 2, wherein the controller actively controls the third driving device.

6. A switching-motion twin stage device according to claim 1, wherein the first driving device further comprises:
   a first pair of electromagnets disposed on an outer bottom surface of the cantilevered stage body opposed to a first plate;
   a second pair of electromagnets disposed on the outer bottom surface of the cantilevered stage body opposed to a second plate; and
   a third pair of electromagnets disposed on an outer side surface of the cantilevered stage body opposed to a third plate,
   wherein the first, second and third pairs of electromagnets are symmetrically placed about a center of gravity of the cantilevered stage such that a point of action of a driving force is set at the center of gravity of the cantilevered stage, and
   wherein the first, second and third pairs of electromagnets are controlled by the controller to prevent a change in an attitude of the cantilevered stage resulting from a reaction force produced due to the driving of at least one of a first table and a second table.

7. A switching-motion twin stage device according to claim 1, further comprising:
   a first countermass floatingly supported for movement in the first direction, wherein when at least one of the first and second cantilevered stages is driven in the first direction, a reaction force in an opposite direction is applied to the first countermass to absorb the reaction force; and
   a second countermass floatingly supported for movement in the second direction, wherein when at least one of the first and second cantilevered stages is driven in the second direction, a reaction force in an opposite direction is applied to the second countermass to absorb the reaction force.

8. A switching-motion twin stage device according to claim 7, further comprising:
   a first trim motor that maintains the first countermass within a first predetermined stroke position so that drifting of the first countermass over time is compensated; and
   a second trim motor that maintains the second countermass within a second predetermined stroke position so that drifting of the second countermass over time is compensated.

9. A switching-motion twin stage device according to claim 8, wherein the controller causes the first and second countermasses to be reset after each scan.

10. A switching-motion twin stage device according to claim 1, wherein a point of action of a driving force in at least one of the first direction and the second direction is set at a center of gravity of at least one of the first and second cantilevered stages.

11. A switching-motion twin stage device according to claim 1, further comprising:
    a first minutely driving device connected to the first cantilevered stage that minutely drives the first table in at least one degree-of-freedom; and
    a second minutely driving device connected to the second cantilevered stage that minutely drives the second table in at least one degree-of-freedom.

12. A switching-motion twin stage device according to claim 11, further comprising:
    a first restraint force generating mechanism that generates a restraint force to restrain a change in an attitude of the first cantilevered stage resulting from a reaction force produced due to the minute driving of the first table; and
    a second restraint force generating mechanism that generates a restraint force to restrain a change in the attitude of the second cantilevered stage resulting from a reaction force produced due to the minute driving of the second table.

13. A switching-motion twin stage device according to claim 12, wherein:
    the controller subjects the first restraint force generating mechanism to feed-forward control in synchronization with the driving of the first table by the first minutely driving device, and subjects the second restraint force generating mechanism to feed-forward control in synchronization with the driving of the second table by the second minutely driving device.

14. A switching-motion twin stage device according to claim 1, wherein the first cantilevered stage and the second cantilevered stage move in a synchronized manner along paths defined by a predetermined minimum distance between the first guide bar and the second guide bar.

15. An exposure apparatus that forms a predetermined pattern on a substrate by exposing the substrate to an energy beam, the exposure apparatus comprising:
    the switching-motion stage device according to claim 1;
    a first table disposed on the first cantilevered stage to hold a first sample; and
    a second table disposed on the second cantilevered stage to hold a second sample, and wherein an overhang distance of the cantilever is minimized such that concurrent movement of exposure and alignment of the first and second samples is synchronized into a similar predetermined region on the first sample and a similar predetermined region on the second sample.

16. An exposure apparatus that forms a predetermined pattern on a substrate by exposing the substrate to an energy beam, the exposure apparatus comprising:
    the switching-motion twin stage device according to claim 1; and
    a third driving device for driving at least one of the first guide bar and the second guide bar in the second direction.

17. A method for performing a switching stage configuration sequence for an exposure apparatus including the switching-motion twin stage device of claim 2, the method comprising the steps of:
    moving at least one of the first and second cantilevered stages which has completed an exposure procedure from an exposed position; and
    synchronously moving the other cantilevered stage which has completed an alignment procedure from an alignment position to the exposure position.

18. A method according to claim 17, further comprising:
    providing an operating base size area having a dimension of 3×3 WS, wherein WS is defined as a length approximately equal to a side of the wafer stage; and
    switching the first and second cantilevered stages in one synchronized step by a length approximately equal to WS.

19. A method according to claim 17, further comprising:
providing an operating base size area having a dimension of 2×3 WS, wherein WS is defined as a length approximately equal to a side of the wafer stage; and
switching the first and second cantilevered stages in two synchronized steps by a length approximately equal to WS+WS.

20. A method according to claim 17, further comprising:
providing an operating base size area having a dimension of 2×2 WS, wherein WS is defined as a length approximately equal to a side of the wafer stage; and
switching the first and second cantilevered stages in three synchronized steps by a length approximately equal to ½ WS+WS+½ WS.

21. An exposure apparatus that forms a predetermined pattern on a plurality of substrates by exposing the substrates to an energy beam, the exposure apparatus comprising:
a base having an alignment area and an exposure area along a first direction;
a first cantilevered stage that is movably supported by the base;
a second cantilevered stage that is movably supported by the base;
a first guide bar disposed on the base along the first direction to guide one of the first cantilevered stage and the second cantilevered stage between the alignment area and the exposure area;
a second guide bar disposed on the base along the first direction to guide other of the first cantilevered stage and the second cantilevered stage between the alignment area and the exposure area, the second guide bar provided at a predetermined distance from the first guide bar in a second direction orthogonal to the first direction; and
a controller that moves the second cantilevered stage in a direction opposite to the direction of movement of the first cantilevered stage to perform a switching of the positions of the first cantilevered stage and the second cantilevered stage.

22. An exposure apparatus according to claim 21, further comprising:
a first restraint force generating mechanism for generating restraint force for restraining a change in attitude of the first cantilevered stage resulting from reaction force produced due to minute driving of the first table; and
a second restraint force generating mechanism for generating restraint force for restraining a change in attitude of the second cantilevered stage resulting from reaction force produced due to minute driving of the second table.

23. An exposure apparatus according to claim 22, wherein:
the controller subjects the first restraint force generating mechanism to feed-forward control in synchronization with the driving of the first table by a first minutely driving device, and subjects the second restraint force generating mechanism to feed-forward control in synchronization with the driving of the second table by a second minutely driving device.

24. An exposure apparatus according to claim 21, further comprising:
a single mark detection system for detecting a position detection mark formed on the substrate of each of the first and second cantilevered stages when either of the cantilevered stages is moved into a first region; and
a single projection optical system for projecting the energy beam onto the substrate on each of the first and second cantilevered stages when either of the cantilevered stages is moved into a second region.

25. An exposure apparatus according to claim 21, further comprising:
a first table disposed on the first cantilevered stage to hold a first substrate; and
a second table disposed on the second cantilevered stage to hold a second substrate.

26. An exposure apparatus according to claim 25, wherein:
the controller performs a switching of a position of the first table and the second table without divorcing between the first table and the first cantilevered stage, and between the second table and the second cantilevered stage.

27. A switching-motion twin stage device having a first cantilevered stage and a second cantilevered stage, comprising:
a first driving device that drives the first cantilevered stage in a first direction;
a second driving device that drives the second cantilevered stage in the first direction;
a first guide bar magnetically coupled at one end of the first guide bar to movably support the first cantilevered stage in a second direction;
a second guide bar magnetically coupled at one end of the second guide bar, opposite to the one end of the first guide bar, to movably support the second cantilevered stage in the second direction, the first guide bar and the second guide bar being capable of traversing each other along a second direction orthogonal to the first direction;
an actuator that applies a counteracting torque to prevent movement of a wafer stage disposed on at least one of the first and second cantilevered stages; and
a controller that performs a switching stage configuration sequence wherein the position of the first and the second cantilevered stages are switched in a synchronized manner.

28. A switching-motion twin stage device according to claim 27, wherein the first guide bar and the second guide bar traverse each other when the cantilevered stages are in a fully retracted position.

29. A switching-motion twin stage device according to claim 27, further comprising:
a third driving device that drives at least one of the first guide bar and the second guide bar only at the one end.

30. A switching-motion twin stage device according to claim 27, wherein a point of action of a driving force in at least one of the first direction and the second direction is set at a center of gravity of at least one of the first and second cantilevered stages.

31. A switching-motion twin stage device according to claim 27, wherein at least one of the first guide bar and the second guide bar is supported by a guide surface connected to reaction frame supports that move in at least one of the first and second directions along a guide device.

32. A switching-motion twin stage device according to claim 27, wherein:
the first cantilevered stage extends and retracts in a direction parallel to a longitudinal axis of the first guide bar; and
the second cantilevered stage extends and retracts in a direction parallel to a longitudinal axis of the second guide bar.

33. A switching-motion twin stage device according to claim 27, wherein the controller controls the first cantilevered stage and the second cantilevered stage such that:

the first cantilevered stage which has received a first operation in a first position is moved from the first position; and the second cantilevered stage which has received a second operation is simultaneously moved into the first position.

34. A method for operating a twin stage device, the twin stage device having a first cantilevered stage and a second cantilevered stage, and including: a first driving device and a second driving device that drive the first and second cantilevered stages in a first direction; and a first guide bar and a second guide bar that movably support the first and second cantilevered stages, respectively, the second guide bar provided at a predetermined minimum distance from the first guide bar in a second direction orthogonal to the first direction, the method comprising the steps of:

providing a first table that is disposed on the first cantilevered stage to hold a first substrate;

providing a second table that is disposed on the second cantilevered stage to hold a second substrate;

moving at least one of the first and second cantilevered stages which has completed an exposure procedure from an exposure position;

synchronously moving the other cantilevered stage, which has completed an alignment procedure, from an alignment position to the exposure position; and switching a position of the first table and the second table without divorcing between the first table and the first cantilevered stage, and between the second table and the second cantilevered stage, the second cantilevered stage moving in a direction opposite to the direction of movement of the first cantilevered stage in the switching step.

35. A method according to claim 34, further comprising:

preventing a change in an attitude of at least one of the first and second cantilevered stages resulting from a reaction force produced due to the driving of at least one of a first table and a second table disposed on the first and second cantilevered stages respectively.

36. A method according to claim 34, further comprising:

absorbing a first reaction force by applying the first reaction force to a first movable countermass;

absorbing a second reaction force by applying the second reaction force to a second movable countermass.

37. A method according to claim 36, further comprising:

compensating for a drift of the first countermass from a first predetermined stroke range along a first direction; and compensating for a drift of the second countermass from a second predetermined stroke range along a second direction.

38. A method according to claim 37, further comprising:

resetting the first and second countermasses to within each of their respective predetermined stroke ranges after each scan.

39. A method according to claim 36, further comprising:

preventing movement of a wafer stage by applying a counteracting torque.

40. A method according to claim 36, further comprising:

applying a driving force at a point of action set at a center of gravity of at least one of the first and the second cantilevered stages.

41. A method according to claim 36, further comprising:

controlling a yawing motion and a rolling motion of at least one of the first and second guide bars along at least one of predetermined first and second directions in a non-contact manner.

42. A stage device having a first stage and a second stage, comprising:

a first driving device having a first moving member and a first stationary member so as to drive the first stage in a first direction;

a first table associated with the first stage, the first table having a first reflective portion extending in a second direction perpendicular to the first direction and a second reflective portion parallel to the first reflective portion;

a first actuator system that is connected to the first stage and the first table to move the first table relative to the first stage in six degrees-of-freedom;

a second driving device having a second moving member and a second stationary member so as to drive the second stage in the first direction;

a second table associated with the second stage, the second table having a third reflective portion extending in the second direction and a fourth reflective portion parallel to the third reflective portion;

a second actuator system that is connected to the second stage and the second table to move the second table relative to the second stage in six degrees-of-freedom;

a first position detector that is capable of emitting a measurement beam to the first reflective portion and the third reflective portion to detect a position of each of the first and second tables;

a second position detector that is capable of emitting a measurement beam to the second reflective portion and the fourth reflective portion to detect a position of each of the first and second tables;

a first guide bar provided with the first stationary member so as to movably support one side of the first stage; and a second guide bar provided with the second stationary member so as to movably support one side of the second stage, the second guide bar being placed at a predetermined distance from the first guide bar in a second direction orthogonal to the first direction.

43. A stage device according to claim 42, further comprising:

a third driving device for driving at least one of the first guide bar and the second guide bar in the second direction.

44. A stage device according to claim 42, wherein the point of action of driving force in the first direction is set at the center of gravity of each of the first and second stages.

45. A stage device according to claim 42, further comprising:

a first table disposed on the first stage so as to hold a first sample;

a first minutely driving device connected to the first stage so as to minutely drive the first table in at least one degree-of-freedom;

a second table disposed on the second stage so as to hold a second sample; and a second minutely driving device connected to the second stage so as to minutely drive the second table in at least one degree-of-freedom.

46. A stage device according to claim 45, further comprising:
a first restraint force generating mechanism for generating restraint force for restraining a change in attitude of the first stage resulting from reaction force produced due to the minute driving of the first table; and
a second restraint force generating mechanism for generating restraint force for restraining a change in attitude of the second stage resulting from reaction force produced due to the minute driving of the second table.

47. A stage device according to claim 46, further comprising:
a control device for subjecting the first restraint force generating mechanism to feed-forward control in synchronization with the driving of the first table by the first minutely driving device and for subjecting the second restraint force generating mechanism to feed-forward control in synchronization with the driving of the second table by the second minutely driving device.

48. A stage device according to claim 43, wherein the third driving device drives the at lease one of the first guide bar and the second guide bar at both ends.

49. A stage device according to claim 48, wherein:
a base of the first moving member is partially enclosed by the first guide bar; and
a base of the second moving member is partially enclosed by the second guide bar.

50. A stage device according to claim 42, further comprising:
a controller connected to the first position detector and the second position detector to control a switching of a position of the first and second tables in accordance with the first and second position detectors.

51. A stage device according to claim 42, further comprising a controller that moves the second stage in a direction opposite to the direction of movement of the first stage to perform a switching of the position of the first stage and the second stage.

52. An exposure apparatus for forming a predetermined pattern on a plurality of substrates by exposing the substrates to an energy beam, the exposure apparatus comprising:
a base having an alignment area and an exposure area along a first direction;
a first stage that is movably supported by the base;
a second stage that is movably supported by the base;
a first driving device having a first moving member and a first stationary member so as to drive the first stage in the first direction;
a first table associated with the first stage, the first table having a first reflective portion extending in a second direction perpendicular to the first direction and a second reflective portion parallel to the first reflective portion;
a first actuator system that is connected to the first stage and the first table to move the first table relative to the first stage in six degrees-of-freedom;
a second driving device having a second moving member and a second stationary member so as to drive the second stage in the first direction;
a second table associated with the second stage, the second table having a third reflective portion extending in the second direction and a fourth reflective portion parallel to the third reflective portion;
a second actuator system that is connected to the second stage and the second table to move the second table relative to the second stage in six degrees-of-freedom;
a first position detector that is capable of emitting a measurement beam to the first reflective portion and the third reflective portion to detect a position of each of the first and second tables;
a second position detector that is capable of emitting a measurement beam to the second reflective portion and the fourth reflective portion to detect a position of each of the first and second tables;
a first guide bar provided with the first stationary member so as to movably support one side of the first stage; and
a second guide bar provided with the second stationary member so as to movably support one side of the second stage, the second stage guide bar being placed at a predetermined distance from the first guide bar in a second direction orthogonal to the first direction.

53. An exposure apparatus according to claim 52, further comprising:
a first restraint force generating mechanism for generating restraint force for restraining a change in attitude of the first stage resulting from reaction force produced due to the minute driving of the first table; and
a second restraint force generating mechanism for generating restraint force for restraining a change in attitude of the second stage resulting from reaction force produced due to the minute driving of the second table.

54. An exposure apparatus according to claim 53, further comprising:
a control device for subjecting the first restraint force generating mechanism to feed-forward control in synchronization with the driving of the first table by the first minutely driving device and for subjecting the second restraint force generating mechanism to feed-forward control in synchronization with the driving of the second table by the second minutely driving device.

55. An exposure apparatus according to claim 52, further comprising:
a single mark detection system for detecting a position detection mark formed on the substrate on each of the first and second stages when the stage is moved into a first region; and
a single projection optical system for projecting the energy beam onto the substrate on each of the first and second stages when the stage is moved into a second region.

56. An exposure apparatus according to claim 52, wherein:
the first guide bar is disposed on the base along the first direction.

57. An exposure apparatus according to claim 52, further comprising:
a controller connected to the first position detector and the second position detector to control a switching of a position of the first and second tables in accordance with the first and second position detectors.

58. An exposure apparatus according to claim 57, wherein:
the controller performs a switching of the position of the first table and the second table without divorcing between the first table and the first stage, and between the second table and the second stage.

59. An exposure apparatus according to claim 52, further comprising a controller that moves the second stage in a direction opposite to the direction of movement of the first stage to perform a switching of the position of the first stage and the second stage.

60. A stage device having a first cantilevered stage, comprising:
- a first driving device having a first moving member and a first stationary member that drives the first cantilevered stage in a first direction;
- a first table disposed on the first cantilevered stage to hold a first sample;
- a first minutely driving device connected to the first cantilevered stage that minutely drives the first table in at least one degree-of-freedom;
- a first restraint force generating mechanism that generates a restraint force to restrain a change in an attitude of the first cantilevered stage resulting from a reaction force produced due to the minute driving of the first table; and
- a first guide bar provided with the first stationary member that movably supports one side of the first cantilevered stage.

61. A stage device according to claim 60, wherein:
- the first table comprises a first reflective portion extending in a second direction perpendicular to the first direction and a second reflective portion parallel to the first reflective portion.

62. A stage device according to claim 60, further comprising:
- a position detector that detects a position of the first table, the position detector emitting a beam to one of the first reflective portion and the second reflective portion.

* * * * *